(12) United States Patent
Fukushima

(10) Patent No.: US 9,081,415 B2
(45) Date of Patent: Jul. 14, 2015

(54) INDICATOR OPERATION DETECTING DEVICE

(71) Applicant: Wacom Co., Ltd., Saitama (JP)

(72) Inventor: Yasuyuki Fukushima, Saitama (JP)

(73) Assignee: Wacom Co., Ltd., Saitama (JP)

( * ) Notice: Subject to any disclaimer, the term of this patent is extended or adjusted under 35 U.S.C. 154(b) by 148 days.

(21) Appl. No.: 13/889,175

(22) Filed: May 7, 2013

(65) Prior Publication Data

US 2013/0342331 A1    Dec. 26, 2013

(30) Foreign Application Priority Data

Jun. 21, 2012  (JP) ................................. 2012-139669

(51) Int. Cl.

| G09B 21/00 | (2006.01) |
|---|---|
| H04B 3/36 | (2006.01) |
| G06F 3/041 | (2006.01) |
| G06F 3/033 | (2013.01) |
| G08C 21/00 | (2006.01) |
| G06F 3/01 | (2006.01) |
| G06F 3/045 | (2006.01) |
| G06F 3/044 | (2006.01) |
| G06F 3/0338 | (2013.01) |

(52) U.S. Cl.
CPC ............... *G06F 3/016* (2013.01); *G06F 3/041* (2013.01); *G06F 3/044* (2013.01); *G06F 3/045* (2013.01); *G06F 3/0338* (2013.01); *H03K 2217/96062* (2013.01)

(58) Field of Classification Search
CPC ......... G06F 3/016; G06F 3/044; G06F 3/041; G06F 3/045; G06F 3/0338; G06F 3/039; G06F 3/048; G06F 2203/04111; G06F 3/033; G06F 3/0362; G06F 3/0412; G06F 2203/04103; G06F 3/03545; H01L 29/7843; G02F 1/13338; H03K 2217/96038
USPC ......... 340/407.2, 710, 407.1, 545.4; 345/173, 345/156, 167, 157, 164, 166, 174; 178/18.03, 18.05, 18.01, 18.06, 19.01, 178/19.03; 341/34; 715/702
See application file for complete search history.

(56) References Cited

U.S. PATENT DOCUMENTS

| 6,094,190 A * | 7/2000 | Kodim ........................... 345/167 |
|---|---|---|
| 6,388,655 B1 * | 5/2002 | Leung ............................ 345/157 |
| 7,321,361 B2 | 1/2008 | Sato et al. |

(Continued)

FOREIGN PATENT DOCUMENTS

| JP | 2003091360 A | 3/2003 |
|---|---|---|
| JP | 2003296014 A | 10/2003 |

*Primary Examiner* — Mirza Alam
(74) *Attorney, Agent, or Firm* — Seed IP Law Group PLLC

(57) ABSTRACT

An indicator operation detecting device includes a sensor including two sets of electrodes intersecting each other, an operation detecting circuit configured to detect a position indicated by an indicator (e.g., a finger) with respect to the sensor as a coordinate value on predetermined coordinate axes (e.g., X and Y axes), and a surface operation part disposed to receive an operation (e.g., touching) of the indicator with respect to the sensor. The surface operation part includes a first input part having a curved surface and employing a corresponding area of the sensor as a detection area, and a second input part having a linear region and employing a corresponding linear area of the sensor surrounded by the area for the first input part as a detection area. A surface shape of the linear region is different from the curved surface of the first input part to be tactilely distinguishable.

19 Claims, 18 Drawing Sheets

(56) References Cited

U.S. PATENT DOCUMENTS

| | | | |
|---|---|---|---|
| 2003/0071784 A1* | 4/2003 | Sato et al. | 345/156 |
| 2010/0149127 A1* | 6/2010 | Fisher et al. | 345/174 |
| 2011/0067933 A1* | 3/2011 | Chang et al. | 178/18.05 |
| 2012/0086651 A1* | 4/2012 | Kwon et al. | 345/173 |
| 2012/0133613 A1* | 5/2012 | Chen et al. | 345/174 |
| 2013/0141357 A1* | 6/2013 | Lo et al. | 345/173 |

\* cited by examiner

INDICATOR OPERATION DETECTING DEVICE

CROSS REFERENCES TO RELATED APPLICATIONS

The present disclosure contains subject matter related to that disclosed in Japanese Priority Patent Application JP 2012-139669 filed in the Japan Patent Office on Jun. 21, 2012, the entire content of which is hereby incorporated by reference.

BACKGROUND

1. Technical Field

This invention relates to an indicator operation detecting device that detects operation of an indicator such as a finger by using a sensor of the capacitive system.

2. Description of the Related Art

In the past, a trackball was used as an indicator operation detecting device to instruct, for example, moving an object displayed on a display screen of a personal computer (hereinafter, abbreviated as PC) in the horizontal direction and the vertical direction of the display screen or rotating the object. The trackball has a structure in which a ball (spherical body) is supported by rotary encoders having rotational axes along directions perpendicular to each other. In association with rolling of this ball by a finger or a palm, a cursor or an object on the display screen is moved in the horizontal direction and the vertical direction of the display screen by the movement amount corresponding to the rotation amount detected by the two rotary encoders.

However, because the trackball moves the cursor or the object by the movement amount corresponding to the rotation of the rotary encoder in association with the rotation of the ball, it can only specify the relative movement amount by this movement operation and, as a result, operation of precisely indicating a coordinate position for the cursor or the object is difficult.

On the other hand, in recent years, there have been increasing opportunities to utilize a touch panel using a sensor for position detection (hereinafter, referred to simply as the sensor) as an indication input device. In particular, the sensor of the capacitive system is superior to the sensor of the resistive film system in the past in terms of the following features, for example: the response speed is high; the durability is high; and plural indicators such as fingers can be simultaneously detected. Therefore, it is satisfactorily used in portable electronic apparatus such as a cell-phone terminal.

The capacitive sensor includes a matrix electrode pattern configured with plural elongate first electrodes parallel to each other and plural elongate second electrodes that intersect these plural first electrodes and are parallel to each other. In this sensor, the first electrodes and the second electrodes are separated from each other by, e.g., a dielectric substrate and are capacitively coupled to each other, and the configuration is so made that a transmission signal is supplied to the first electrode and a received signal is obtained from the second electrode via the capacitive coupling for example.

In this capacitive sensor, at the part with which an indicator such as a finger contacts the matrix electrode pattern, part of the transmission signal flows through the human body and thereby the received-signal current obtained from the second electrode changes. Thus, the position indicated by the indicator such as a finger is detected by detecting this change. The position indicated by the indicator is detected as the intersection of the first electrode and the second electrode.

In this case, normally, for example, a first direction along which the first electrodes are formed along the horizontal direction of the operation by the operator and this horizontal direction is defined as the X-axis direction of the two-dimensional coordinates of the position that is indicated by the indicator and is detected by the sensor. Furthermore, a second direction along which the second electrodes are formed along the vertical direction perpendicular to the horizontal direction of the operation by the operator and this vertical direction is defined as the Y-axis direction of the two-dimensional coordinates of the sensor. The sensor detects and outputs the position indicated by the indicator as the X- and Y-coordinate values on the two-dimensional coordinates.

Furthermore, as described above, the X-axis direction and the Y-axis direction of the two-dimensional coordinates of the position indicated by the indicator in the sensor are made to correspond with the horizontal direction and the vertical direction of the operation by the operator and thus are made to correspond to the horizontal direction and the vertical direction of the display screen. That is, the coordinate space defined by the X-axis direction and the Y-axis direction of the two dimensional coordinates as the output coordinates of the sensor is made to correspond to the coordinate space defined by the horizontal direction and the vertical direction of the display screen. In the following description, the coordinate space of the output coordinates of the sensor, defined by e.g., the X-axis direction and the Y-axis direction of two dimensional coordinates, will be referred to as the output coordinate space of the sensor.

For example, Patent Document 1 (Japanese Patent Laid-Open No. 2003-91360) and Patent Document 2 (Japanese Patent Laid-Open No. 2003-296014) disclose an indicator operation detecting device using a capacitive sensor like the one described above. In this device, the shape of an operation section to which position indication operation is carried out by an indicator is set to a three-dimensional shape in pursuit of the more intuitive input. Specifically, the indicator operation detecting device disclosed in patent documents 1 and 2 has an operation surface made as a curved surface by three-dimensional molding of a predetermined area of the indicator-detectable area of the matrix electrode pattern of the sensor into a dome shape.

When the operation surface is made as a curved surface, when the operator moves his finger on the operation surface with the finger in contact with the operation surface, the operator can feel, in addition to movement sensation, sensation of displacement in the height direction of the curved shape based on the inclination direction and the inclination degree of the curved surface. Therefore, according to the indicator operation detecting device described in Patent Documents 1 and 2 and having the curved operation surface, the operator can easily understand the operation position of the finger, the movement direction of the finger, and the movement amount and thus can obtain a good feel of operability.

Furthermore, according to the above-described indicator operation detecting device described in Patent Documents 1 and 2, the contact position of an indicator such as a finger is detected by the matrix electrode pattern of the sensor based on the capacitive system. Therefore, the absolute coordinates of the position indicated by the indicator can be detected and the coordinate output of indication operation is more accurate than by the trackball.

BRIEF SUMMARY

In the above-described indicator operation detecting device described in Patent Documents 1 and 2, by moving an indicator such as a finger being in contact with the operation surface having a three-dimensional curved shape, the operator can make various indication operation inputs such as linear indication operation and rotational (circular arc) indication operation on this operation surface. The indicator operation detecting device outputs information on the indication operation by the indicator, such as a finger on this operation surface, as a series of X- and Y-coordinate values (X-, Y-, and Z-coordinate values) as position information of the indicator on two-dimensional coordinates based on the X axis and the Y axis perpendicular to each other (depending on the case, three-dimensional coordinates further including the Z axis perpendicular to the X axis and the Y axis).

As described above, a PC executes display control processing so that a cursor or an object displayed on the display screen may be moved on the display screen in association with indication operation based on information on the indication operation received from this indicator operation detecting device.

By the way, on the operation surface having a three-dimensional curved shape in the above-described indicator operation detecting device of Patent Documents 1 and 2, various kinds of indication operation including not only linear indication operation but also rotational (circular arc) indication operation utilizing this curved shape are possible. Meanwhile, it is important that the linear indication operation, particularly linear indication operation along the X-axis direction and the Y-axis direction of the output coordinate space of the sensor, can be carried out accurately and surely also on the operation surface having such a three-dimensional curved shape in order for these linear indication operations to be compatible with e.g., horizontal scroll operation and vertical scroll operation of the display screen. Furthermore, generally the X-axis direction and the Y-axis direction of the output coordinate space of the sensor correspond to the horizontal direction and the vertical direction of the display screen as described above. Thus, it is important that the linear indication operation along these X-axis direction and Y-axis direction can be carried out accurately and surely also in that the linear movement of a displayed object based on the linear indication operation easily allows a determination as to whether the movement is accurate on the display screen.

However, in the indicator operation detecting device of Patent Documents 1 and 2, because the operation surface is a curved surface, it is not easy to carry out indication operation in a linear direction by an indicator such as a finger to obtain accurate straight movement, and instead rounded movement indication depending on the curved surface tends to be made.

The above-described indicator operation detecting device uses the sensor with the matrix electrode pattern as described above and therefore can detect the absolute coordinates of the indication operation position of the indicator. Thus, a cursor or an object moves on the display screen just in accordance with the indication operation by the indicator on the operation surface. Accordingly, the cursor or the object possibly moves in a rounded manner although the operator intends to make linear indication.

Furthermore, in the case of the operation surface having a three-dimensional curved shape such as a dome shape, also because the circumference thereof has a substantially circular shape, the operator cannot recognize which linear direction is the X-axis direction or the Y-axis direction of the output coordinate space of the sensor based on the touch sensation on the operation surface having this curved shape.

Therefore, the operator who operates the device while looking mainly at the screen has to make an operation input by inferring the X-axis direction and the Y-axis direction of the output coordinate space of the sensor based on the shape relationship between the operation surface having the three-dimensional curved shape and the chassis of the indicator operation detecting device, or by relying on a mark that is provided on the chassis by e.g., printing to indicate the X-axis direction and the Y-axis direction. Even in this case, it is difficult for the operator to accurately carry out linear indication operation in a specific direction such as the X-axis direction or the Y-axis direction of the output coordinate space of the sensor because there is no clue in view of the touch sensation on the operation surface having the curved shape.

Moreover, if the operation surface part of the indicator operation detecting device has a three-dimensional shape with a curved surface that is convex toward the side which an indicator contacts, like in Patent Documents 1 and 2, there is also a problem that the contact area between the indicator such as a finger and the convex operation surface tends to be small and it is difficult for the sensor to detect linear indication operation accurately and surely.

In view of the above-described points, according to one aspect of this invention, an indicator operation detecting device is provided, which is so configured that linear indication operation in a coordinate axis direction of the output coordinate space of a sensor can be carried out accurately and surely even if the operation surface has a three-dimensional curved shape.

To solve the above-described problems, an embodiment of this invention provides an indicator operation detecting device including a sensor, in which a plurality of first electrodes are disposed along a first direction and a plurality of second electrodes intersecting the plurality of first electrodes are disposed along a second direction different from the first direction, an operation detecting circuit that is connected to the plurality of first electrodes and the plurality of second electrodes and detects a position indicated by an indicator with respect to the sensor as a coordinate value on predetermined coordinate axes based on a capacitive system, and a surface operation part disposed on the side of receiving indication operation of the indicator with respect to the sensor. In the indicator operation detecting device, the surface operation part includes a first input part and a second input part. The first input part has a curved surface that is so formed as to employ a predetermined area of the sensor as a detection area of the indicator in the first input part. The second input part is so formed as to employ a linear specific area, which is an area surrounded by the predetermined area of the sensor employed as the detection area of the first input part and which extends along a specific direction with respect to the directions of the coordinate axes, as a detection area of the indicator in the second input part. The surface shape of the linear specific area is different from that of the curved surface of the first input part so that the operator can tactilely distinguish the second input part from the first input part.

In the indicator operation detecting device of the invention with the above-described configuration, the first input part has a three-dimensional curved surface having a predetermined shape such as a dome shape. Therefore, according to the indicator operation detecting device of this invention, at this first input part having the three-dimensional curved surface, the operation position of a finger, the movement direction of the finger, and the movement amount in its detection area of the indicator can be easily grasped and a good feel of operability can be achieved.

The second input part is the linear specific area along the specific direction with respect to the directions of the predetermined coordinate axes that define the position indicated by the indicator with respect to the sensor and is so formed as to have a surface whose surface shape is different from that of the curved surface of the first input part. Thus, the operator can easily recognize the second input part surrounded by the first input part based on the difference in the surface shape. This allows the operator to carry out linear input operation accurately and surely along the linear specific area of this second input part.

Furthermore, the linear specific area of the second input part is formed along the specific direction with respect to the directions of the predetermined coordinate axes that define the position indicated by the indicator with respect to the sensor, specifically e.g., the linear direction corresponding with the direction of the coordinate axis. This allows the operator to easily carry out a liner operation input along the coordinate axis by performing linear indication operation along the linear specific area of this second input part.

The invention can provide an indicator operation detecting device capable of accurately and surely carrying out linear indication operation in the specific direction with respect to the directions of the predetermined coordinate axes that define the position indicated by the indicator with respect to the sensor in the case in which the operation surface has a three-dimensional curved shape.

DETAILED DESCRIPTION

Figure 1:
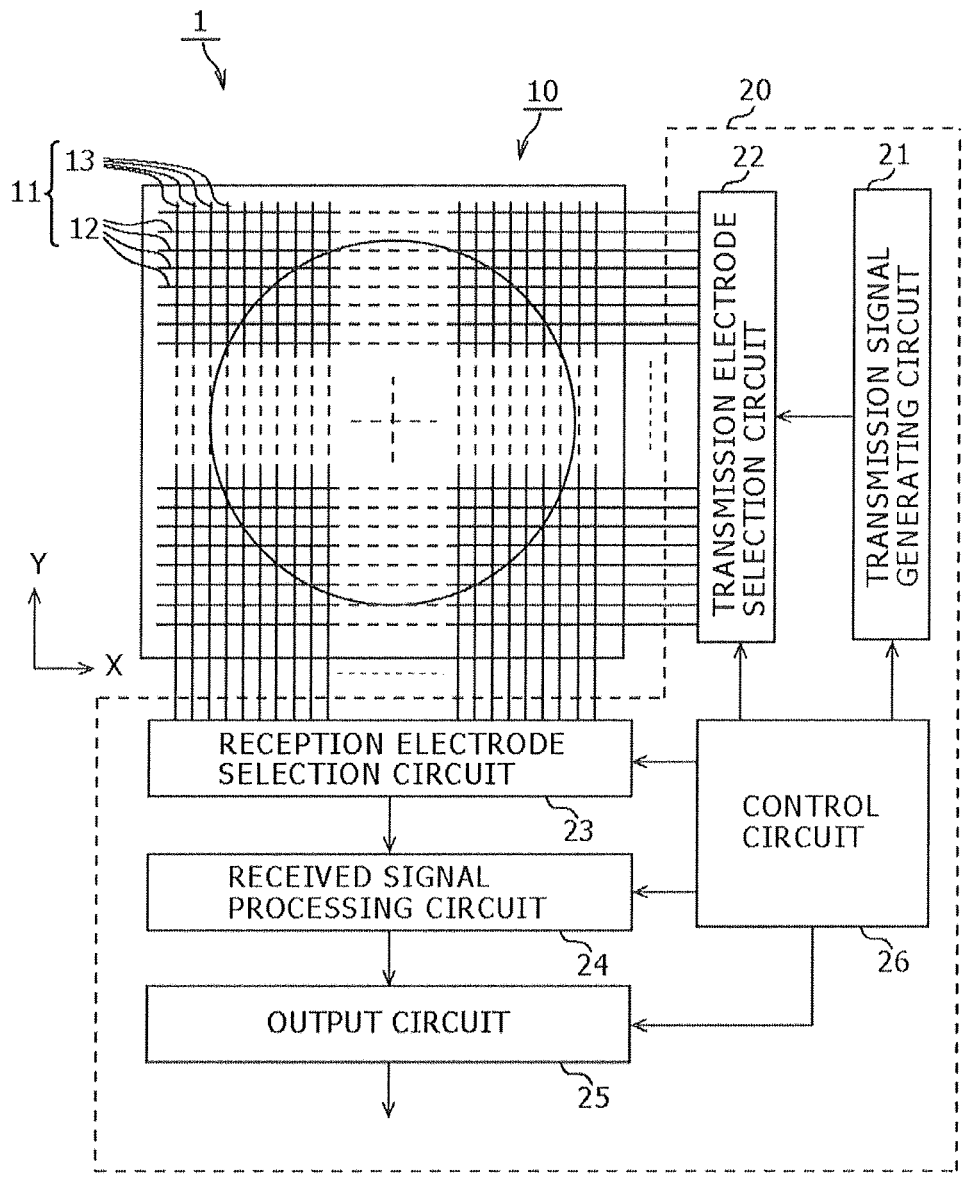
FIG. 1 is a diagram for explaining the connection relationship between a sensor and an operation detecting circuit in an indicator operation detecting device according to a first embodiment of this invention.

Indicator operation detecting devices according to several embodiments of this invention will be described below with reference to the drawings.
First Embodiment FIG. 1 is a diagram showing a configuration example of an indicator operation detecting device 1 of a first embodiment. The indicator operation detecting device 1 is composed of a sensor 10 and an operation detecting circuit 20.

In this example, the sensor 10 has a configuration of a sensor of the cross-point capacitive system and includes an electrode group 11 arranged in a lattice manner. This electrode group 11 is configured by disposing plural first electrodes 12 formed to extend along a first direction and plural second electrodes 13 formed to extend along a second direction intersecting this first direction in such a manner that the first electrodes 12 and the second electrodes 13 intersect each other in an electrically-insulated state.

The plural first electrodes 12 are each disposed along the first direction and are disposed in parallel to each other at every predetermined interval, and the plural second electrodes 13 are each disposed along the second direction and are disposed in parallel to each other at every predetermined interval.

In this example, the sensor 10 detects an indicator such as a finger as coordinate values in the output coordinate space of two-dimensional coordinates composed of the X-axis direction and the Y-axis direction perpendicular to each other. Furthermore, in this first embodiment, the first direction, along which the first electrodes 12 are formed, is defined as the X-axis direction of the output coordinate space of the sensor 10, and the second direction, along which the second electrodes 13 are formed, is defined as the Y-axis direction of the output coordinate of the sensor 10. The position indicated by the indicator is detected as the coordinate values of the intersection of the first electrode 12 and the second electrode 13.

The operation detecting circuit 20 as a signal processing circuit section is provided for the sensor 10, in which the first electrodes 12 and the second electrodes 13 are disposed in the above-described manner. As shown in FIG. 1, this operation detecting circuit 20 includes a transmission signal generating circuit 21, a transmission electrode selection circuit 22, a reception electrode selection circuit 23, a received signal processing circuit 24, an output circuit 25, and a control circuit 26.

The transmission signal generating circuit 21 and the transmission electrode selection circuit 22 configure a transmission signal supply circuit, and the reception electrode selection circuit 23 and the received signal processing circuit 24 configure a signal receiving circuit. In this example, the first electrodes 12 are used as transmission electrodes to which a transmission signal is supplied and the second electrodes 13 are used as reception electrodes that are capacitively coupled to the first electrodes 12 and obtain a received signal depending on the transmission signal.

The transmission signal generating circuit 21 supplies the predetermined transmission signal to the transmission electrode selection circuit 22 at the timing in accordance with control by the control circuit 26. The transmission electrode selection circuit 22 selects the predetermined first electrode 12 in accordance with selection control by the control circuit 26. The transmission signal is supplied from the transmission signal generating circuit 21 to the first electrode 12 selected by the transmission electrode selection circuit 22.

The reception electrode selection circuit 23 sequentially selects the second electrodes 13 in accordance with control by the control circuit 26 and supplies the received signal from the selected second electrode 13 to the received signal processing circuit 24.

The received signal processing circuit 24 processes the received signal based on control by the control circuit 26 to detect change in the signal level of the received signal, caused due to indication of a position on the sensor 10 by the indicator such as a finger, for each of the second electrodes 13, and supply the detection output thereof to the output circuit 25.

The output circuit 25 detects the second electrode 13 in which the signal change has occurred from the detection output of the received signal processing circuit 24 based on control by the control circuit 26. Then, the output circuit 25 generates and outputs a detection signal to show the position indicated by the indicator such as a finger as the X- and Y-coordinate values of the output coordinate space of the sensor 10 based on the detected second electrode 13 and the first electrode 12 to which the transmission signal is supplied at this time.

Configuration Example of Sensor 10

Figure 2A:
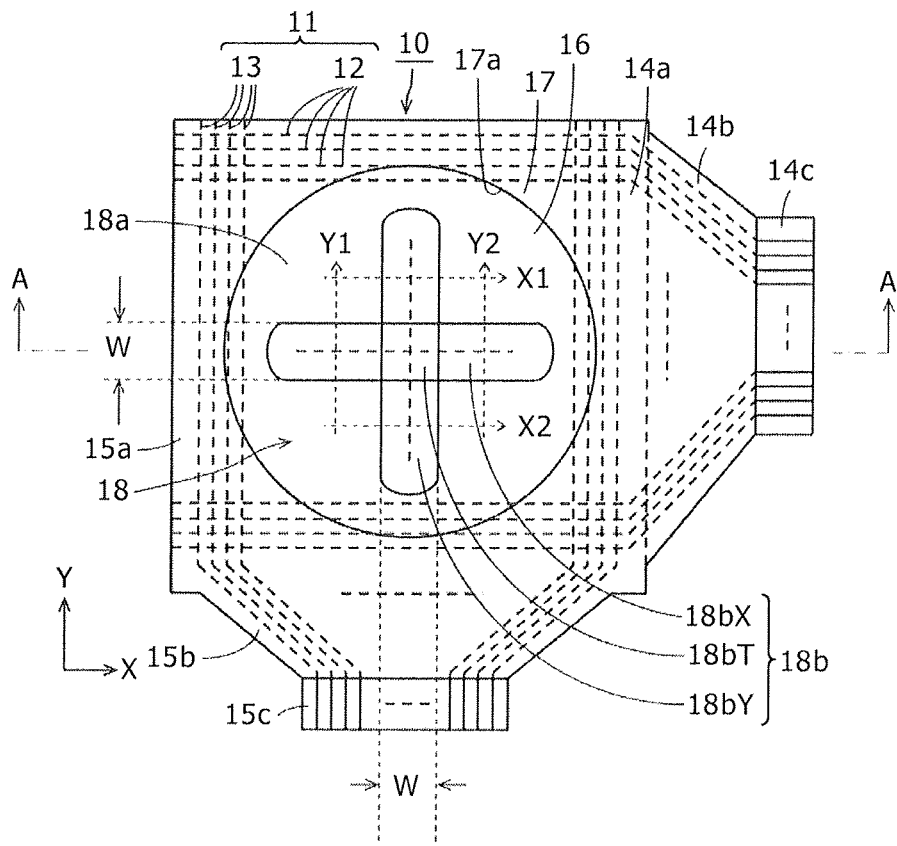
FIGS. 2A to 2D are diagrams for explaining the major parts of the indicator operation detecting device according to the first embodiment of this invention.
Figure 2B:
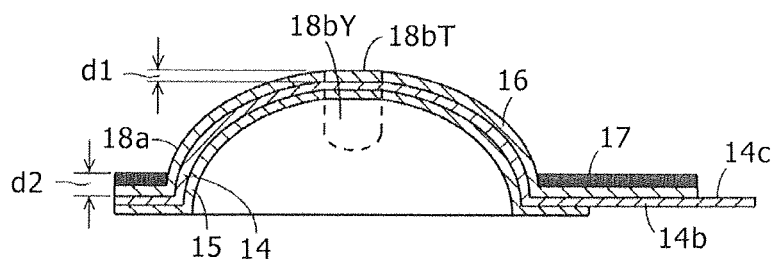
Figure 2C:
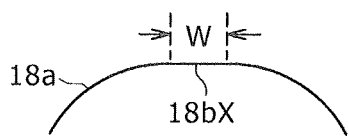
Figure 2D:
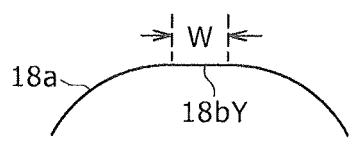
Figure 3A:
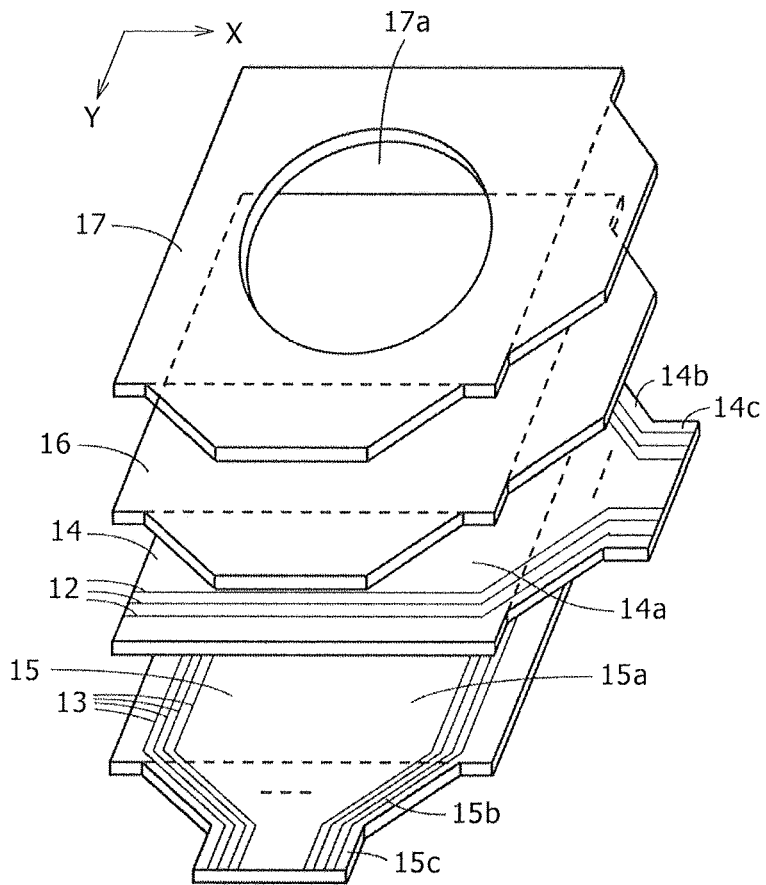
FIGS. 3A and 3B are diagrams for explaining the major parts of the indicator operation detecting device according to the first embodiment of this invention.
Figure 3B:
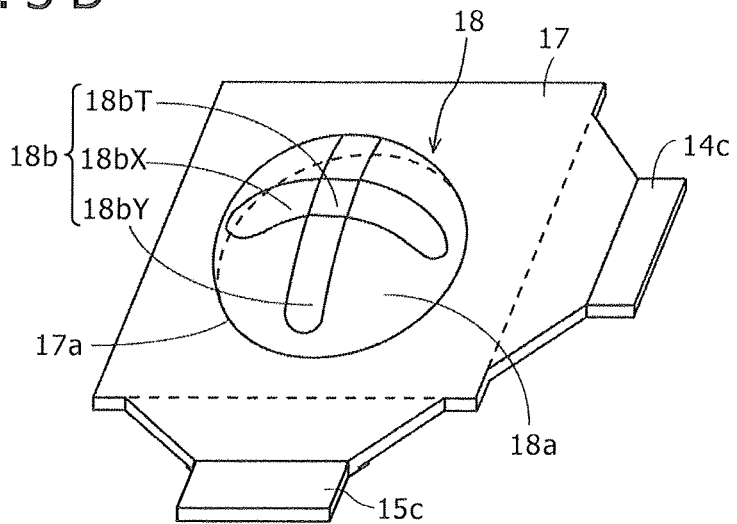

FIGS. 2A to 2D and FIGS. 3A and 3B show a detailed configuration example of the sensor 10. FIG. 2A is a diagram when the sensor 10 is viewed from the side of the surface on which operation is performed by an indicator. FIG. 2B is a sectional view along line A-A in FIG. 2A. FIGS. 2C and 2D are diagrams for explaining the curved shape of the operation surface of the sensor 10. FIG. 3A is an exploded configuration diagram of the sensor 10, and FIG. 3B is a perspective view of the sensor 10.

The sensor 10 has a configuration in which the electrode group 11 arranged in a lattice manner is three-dimensionally molded into a dome shape as shown in FIGS. 2B and 3B. As shown in FIGS. 2B and 3A, the sensor 10 of this example has a four-layer structure composed of a first sheet-shaped substrate 14, a second sheet-shaped substrate 15, a protective sheet 16, and a dead-zone-forming sheet 17. All of these first sheet-shaped substrate 14, second sheet-shaped substrate 15, protective sheet 16, and dead-zone-forming sheet 17 are formed by a dielectric material. A fabrication method of this sensor 10 will be described below with reference to FIGS. 3A and 3B.

First, the first sheet-shaped substrate 14, the second sheet-shaped substrate 15, and the protective sheet 16 are originally in a state of a planar sheet shape as shown in FIG. 3A. The dead-zone-forming sheet 17 has a planar sheet shape and a penetration hole 17a is made in the circular area corresponding to a dome-shaped part 18 to be described later as shown in FIG. 3B.

On the surface of the first sheet-shaped substrate 14 having the planar sheet shape, as shown in FIG. 3A, plural line-shaped conductors along the X-axis direction are formed in parallel to each other and thereby the plural first electrodes 12 are formed. The first sheet-shaped substrate 14 includes a rectangular area 14a in which the plural first electrodes 12 are disposed and a lead area 14b extended from this rectangular area 14a along the forming direction of the plural first electrodes 12 as shown in FIG. 3A. In FIGS. 3A and 3B, dashed lines are shown on the first sheet-shaped substrate 14 and the second sheet-shaped substrate 15 as well as on the protective sheet 16 and the dead-zone-forming sheet 17 in order to clearly indicate the rectangular areas 14a and 15a from the lead areas 14b and 15b. However, these lines are for explanation and do not exist in the actual configuration.

A lead pattern for connecting each of the plural first electrodes 12 to an external circuit section is formed in the lead area 14b, and an external connection part 14c is formed at the tip part of the lead area 14b. In this external connection part 14c, the transmission electrode selection circuit 22 of the operation detecting circuit 20 is connected to the plural first electrodes 12. In this example, a square area is employed as the rectangular area 14a.

Similarly, on the surface of the second sheet-shaped substrate 15 having the planar sheet shape, plural line-shaped conductors along the Y-axis direction are formed in parallel to each other and thereby the plural second electrodes 13 are formed. The second sheet-shaped substrate 15 includes the rectangular area 15a in which the plural second electrodes 13 are disposed and the lead area 15b extended from this rectangular area 15a along the forming direction of the plural second electrodes 13 as shown in FIG. 3A.

A lead pattern for connecting each of the plural second electrodes 13 to an external circuit section is formed in this lead area 15b, and an external connection part 15c is formed at the tip part of the lead area 15b. In the external connection part 15c, the reception electrode selection circuit 23 of the operation detecting circuit 20 is connected to the plural second electrodes 13. A square area having the same size as that of the rectangular area 14a is employed as the rectangular area 15a.

In this example, the protective sheet 16 includes a rectangular area of a square having the same size as that of the rectangular areas 14a and 15a and areas that are extended outward from two adjacent sides of this rectangular area and correspond to the lead areas 14b and 15b.

The dead-zone-forming sheet 17 is a member for preventing the first and second sheet-shaped substrates 14 and 15 from detecting the indicator such as a finger. In this example, it is composed of a dielectric having such a thickness as to isolate the indicator such as a finger so that the first and second sheet-shaped substrates 14 and 15 may be prevented from detecting the indicator. Furthermore, in this example, this dead-zone-forming sheet 17 has the same shape as that of the protective sheet 16. In addition, the penetration hole 17a in which the dome-shaped part to be described later is disposed is formed at the center part of its rectangular area as described above.

The first sheet-shaped substrate 14, on which the first electrodes 12 are formed, is overlapped on the front surface side of the second sheet-shaped substrate 15, on which the second electrodes 13 are formed in the above-described manner, and both are bonded. At this time, the first sheet-shaped substrate 14 and the second sheet-shaped substrate 15 are so disposed that their rectangular areas 14a and 15a overlap with each other and the directions of the first electrodes 12 and the second electrodes 13 are perpendicular to each other (see FIGS. 2A and 3A). In this state, the plural first electrodes 12 and the plural second electrodes 13 are so disposed as to be vertically distant from each other by the thickness of the first sheet-shaped substrate 14 composed of a dielectric material to be insulated from each other.

Next, the protective sheet 16 is further overlapped and bonded onto the first sheet-shaped substrate 14. In this case, as shown in FIG. 3A, the protective sheet 16 is given such a shape that at least the rectangular area 14a of the first sheet-shaped substrate 14 and the rectangular area 15a of the second sheet-shaped substrate 15 are covered and the external connection parts 14c and 15c are exposed to the external. Furthermore, the dead-zone-forming sheet 17 having the same outer shape as that of the protective sheet 16 is overlapped and bonded onto the protective sheet 16 with their outer shapes aligned. Because the penetration hole 17a is formed in the dead-zone-forming sheet 17, the protective sheet 16 is exposed through this penetration hole 17a.

Next, in the rectangular areas 14a and 15a of four layers of the sheet members bonded in the above-described manner, the three-layer part of the first sheet-shaped substrate 14, the second sheet-shaped substrate 15, and the protective sheet 16 in the circular area corresponding to the penetration hole 17a of the dead-zone-forming sheet 17 is vacuum molded to be turned to the three-dimensional dome-shaped part 18 as shown in FIGS. 2B and 3B. In the case of this example, the dome-shaped part 18 becomes such a state as to swell out from the penetration hole 17a of the dead-zone-forming sheet 17.

In this sensor 10, at the time of indication operation of an indicator such as a finger, the indicator such as a finger is distant from the electrode group 11 by only the thickness d1 of the protective sheet 16 in the dome-shaped part 18 swelling out from the penetration hole 17a as shown in FIG. 2B. Thus, the indicator such as a finger in contact with the surface of the protective sheet 16 is surely detected. In contrast, in the peripheral area of the dome-shaped part 18, the indicator such as a finger is distant from the electrode group 11 by a thickness d2 obtained by adding the thickness of the dead-zone-forming sheet 17 to the thickness of the protective sheet 16 as shown in FIG. 2B. Thus, this peripheral area works as a dead-zone area in which the indicator such as a finger cannot be detected.

As described above, in this embodiment, the operator can make an operation indication input by carrying out indication operation on the surface of the protective sheet 16 of the dome-shaped part 18 with a finger. That is, in this example, the sensor 10 itself is three-dimensionally molded to form the dome-shaped part 18, and this dome-shaped part 18 serves as a surface operation part. Therefore, in this example, the surface operation part is configured monolithically with the sensor 10.

Furthermore, in this example, as shown in FIGS. 2A to 2D and 3B, the operation surface of the surface operation part formed of the dome-shaped part 18 is not given a uniform curved shape and has a first input part 18a and a second input part 18b that can be discriminated from each other by the operator based on the touch sensation.

The first input part 18a is an input part having a curved surface according to the dome shape in this example. The second input part 18b is composed of an X-axis-direction guide part 18bX that has a width W and is linearly formed into a band shape along the X-axis direction and a Y-axis-direction guide part 18bY that has the width W and is linearly formed into a band shape along the Y-axis direction in this example.

Of the indicator detection area in the dome-shaped part 18 of the sensor 10, the area except the X-axis-direction guide part 18bX and the Y-axis-direction guide part 18bY serves as the indicator detection area of the first input part 18a. The areas that correspond to the X-axis-direction guide part 18bX and the Y-axis-direction guide part 18bY of the sensor 10 and are each linear serve as the indicator detection area of the second input part 18b.

In the X-axis-direction guide part 18bX, the curvature p is set to zero (not a curve but a straight line) across the part of the width W in the direction perpendicular to the forming direction of its linear band shape so that the operator can discriminate the X-axis-direction guide part 18bX from the curved surface of the first input part 18a based on the touch sensation (see FIGS. 2B and 2C). Similarly, in the Y-axis-direction guide part 18bY, the curvature p is set to zero across the part of the width W in the direction perpendicular to the forming direction of its linear band shape (see FIGS. 2B and 2D). Therefore, a top part 18bT of the dome-shaped part 18, at which the X-axis-direction guide part 18bX and the Y-axis-direction guide part 18bY intersect, is a flat square surface whose four sides each have the length W (see FIGS. 2B and 3B). The width W of the X-axis-direction guide part 18bX and the Y-axis-direction guide part 18bY is set to such a width that, when the ball of the human finger contacts the guide part, the contact area falls within the guide part.

In this embodiment, the first input part 18a and the second input part 18b having the above-described configuration are formed when the dome-shaped part 18 is vacuum molded.

Figure 4A:
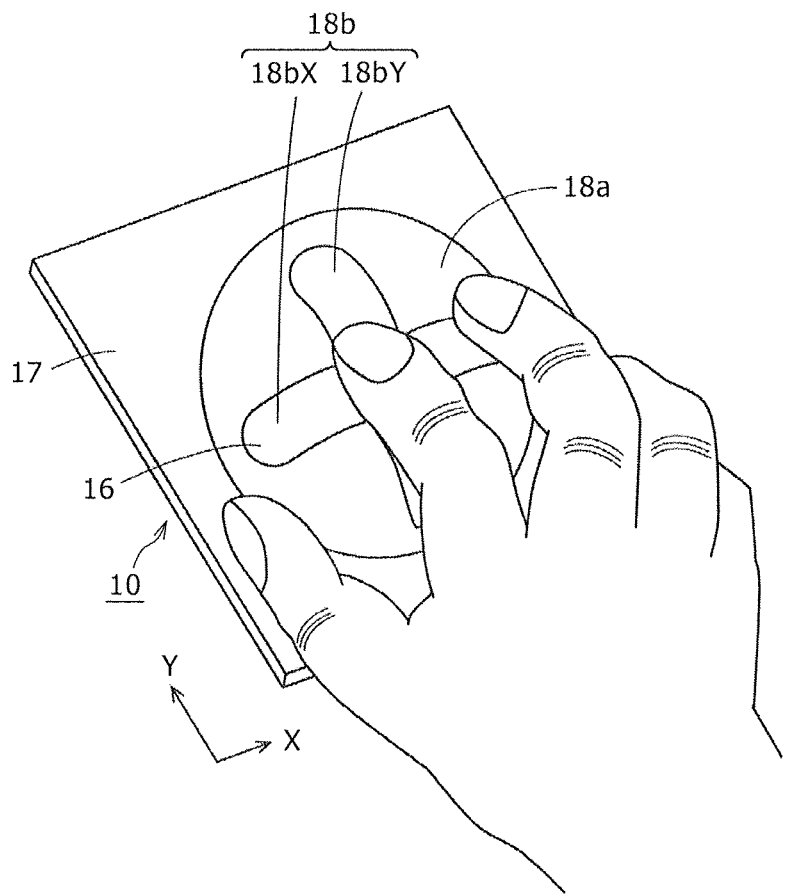
FIGS. 4A to 4C are diagrams for explaining a form of operation by a finger as an indicator with the indicator operation detecting device according to the first embodiment of this invention.

As shown in FIG. 4A, when carrying out contact operation with a finger on the surface operation part of the dome-shaped part 18 of the sensor 10, the operator can feel, based on the touch sensation, each of the X-axis-direction guide part 18bX and the Y-axis-direction guide part 18bY of the second input part 18b against the curved surface of the first input part 18a as a part in which the height of a flat surface having the width W changes along the curved surface of the dome shape.

Therefore, the operator can carry out linear indication operation in the X-axis direction by performing operation along the X-axis-direction guide part 18bX by distinguishing between the first input part 18a and the second input part 18b. Furthermore, the operator can carry out linear indication operation in the Y-axis direction by performing operation along the Y-axis-direction guide part 18bY. With the first input part 18a, the operator can carry out rotational indication operation by performing operation of tracing the outer circumferential curved surface in a circular pattern with a finger.

Figure 5A:
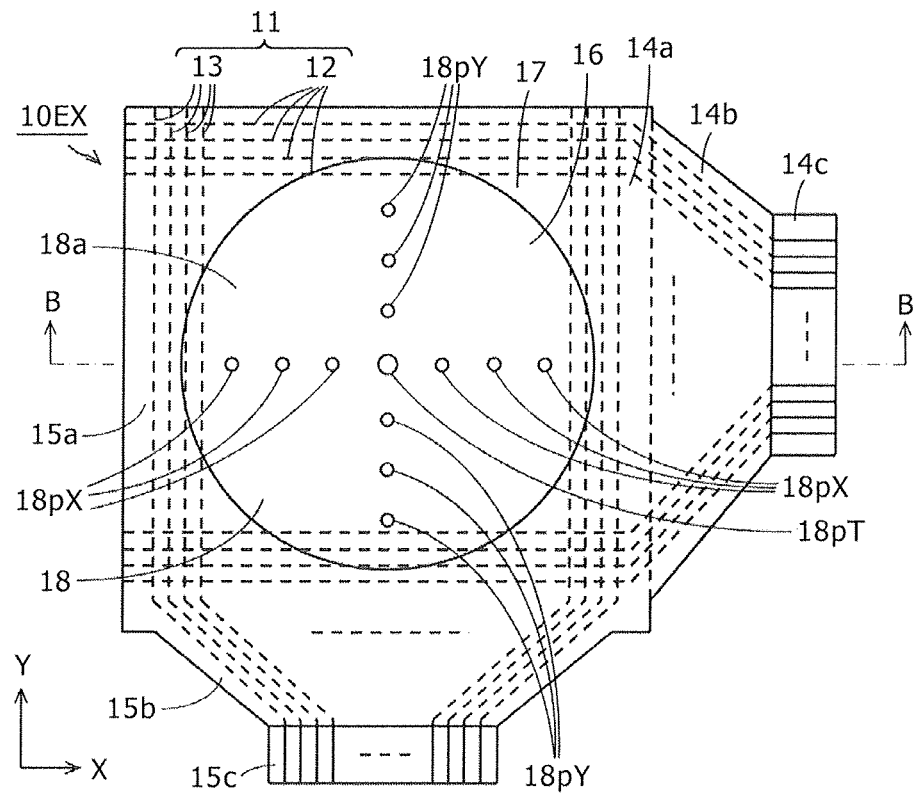
FIGS. 5A and 5B are diagrams for explaining a comparative example of the indicator operation detecting device according to the first embodiment of this invention.
Figure 5B:
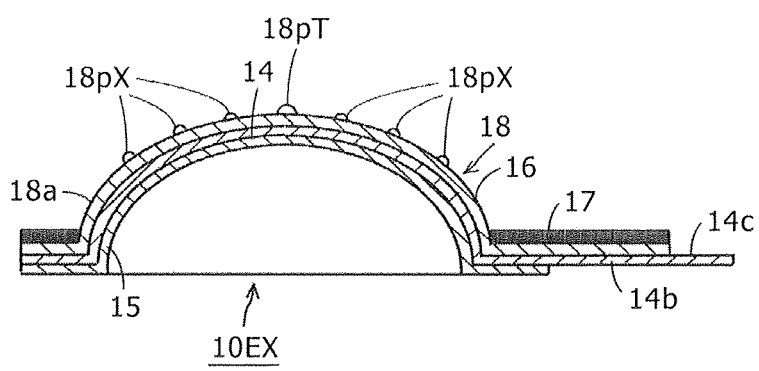

In this embodiment, the X-axis-direction guide part 18bX and the Y-axis-direction guide part 18bY of the second input part 18b are given a surface shape that can be felt not as a curved convex surface but as a flat surface. Thus, the contact area of a finger at this part is large. This allows the sensor 10 to detect operation by the operator at this second input part 18b with high sensitivity. This feature will be further explained with reference to a sensor 10EX of a comparative example shown in FIGS. 5A and 5B. FIG. 5A is a diagram when the sensor 10EX is viewed from the side of the surface on which operation is performed by an indicator and corresponds to FIG. 2A of the sensor 10 of the above-described example. FIG. 5B is a sectional view along line B-B in FIG. 5A.

In the sensor 10EX of this comparative example, as guides for linear indication operation in the X-axis direction and the Y-axis direction, plural protrusions 18pX are arranged in one row along the X-axis direction and plural protrusions 18pY are arranged in one row along the Y-axis direction as shown in FIGS. 5A and 5B, instead of the X-axis-direction guide part 18bX and the Y-axis-direction guide part 18bY of the second input part 18b in the dome-shaped part 18 of the sensor 10 of the first embodiment. Furthermore, in this sensor 10EX, a protrusion 18pT at the top part of the dome-shaped part 18, at which the arrangement of the plural protrusions 18pX along the X-axis direction intersects the arrangement of the plural protrusions 18pY along the Y-axis direction, is set larger than the other protrusions, for example, so that it can be distinguished. The other configuration of the sensor 10EX of the comparative example is the same as that of the sensor 10.

According to the sensor 10EX of this comparative example of FIGS. 5A and 5B, the operator can carry out linear indication operation in the X-axis direction by performing operation of tracing the plural protrusions 18pX and can carry out linear indication operation in the Y-axis direction by performing operation of tracing the plural protrusions 18pY. Furthermore, the protrusion 18pT at the top part is set larger than the other protrusions 18pX and 18pY and thus can be distinguished based on the touch sensation. Therefore, the intersection of the X-axis direction and the Y-axis direction can also be easily felt.

Figure 4B:
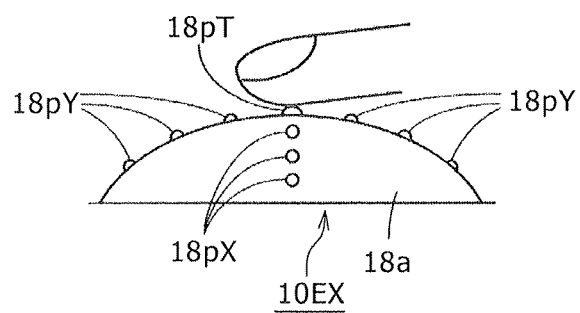

However, there is the following problem in the case of the method in which the protrusions 18pX, 18pY, and 18pT that can be sensed based on the touch sensation are provided along the X-axis direction and the Y-axis direction like in the sensor 10EX of this comparative example. Specifically, as shown in FIG. 4B, when the operator operates the sensor by tracing the protrusions with a finger, the finger runs on these protrusions 18pX, 18pY, and 18pT. Thus, the contact area between the finger and the operation surface is small and the detection output of the indication operation performed by the finger is often interrupted. Accordingly, possibly the linear indication operation by the finger may not be stably detected.

Figure 4C:
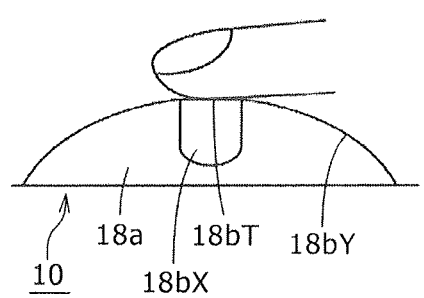

In contrast, in the case of the sensor 10, the X-axis-direction guide part 18bX and the Y-axis-direction guide part 18bY are given a surface shape that can be felt not as a convex shape but as a flat surface in this embodiment. Thus, as shown in FIG. 4C, the contact area of the finger is large at the X-axis-direction guide part 18bX and the Y-axis-direction guide part 18bY, which provides an effect that the linear indication operation by the finger can be detected with high sensitivity.

By the way, in this embodiment, even with the sensor having the surface operation part with a three-dimensional shape like the above-described dome-shaped part 18, linear indication operation in the X-axis direction or the Y-axis direction can be carried out by performing operation along the X-axis-direction guide part 18bX or the Y-axis-direction guide part 18bY. However, because the surface operation part is three-dimensional, a finger, palm, etc. often inadvertently contacts the part other than the X-axis-direction guide part 18bX and the Y-axis-direction guide part 18bY.

For example, in the case of the above-described dome-shaped part 18, in operation input with a finger, subtle movement of the finger in the height direction (Z-axis direction) perpendicular to the X-Y coordinate plane also accompanies movement in the X-Y coordinate plane. Therefore, it is often difficult to accurately perform indication operation along the X-axis-direction guide part 18bX or the Y-axis-direction guide part 18bY by a finger with the hand and other fingers floated from the sensor 10. Therefore, in many cases, the operator performs operation while putting the thumb, middle finger, ring finger, or palm (e.g., the thenar part) on the peripheral area of the dome-shaped part 18 as the base for performing indication operation with subtle adjustment of force for the finger used to make the indication operation input (generally, with an index finger).

In such a case, because the first and second sheet-shaped substrates 14 and 15 of the sensor 10 employ the rectangular area as the indicator detection area, the thumb, middle finger, ring finger, or palm, which is used only as the base for the indication operation with the index finger and essentially has no relation to the intention of the indication operation, is also detected as an indicator by the sensor 10.

However, in the sensor 10 of the above-described first embodiment, the configuration is so made that the indicator is prevented from being detected by the dead-zone-forming sheet 17 in the peripheral area of the surface operation part formed of the dome-shaped part 18 as described above. Therefore, according to the indicator operation detecting device of this embodiment, for example as shown in FIG. 4A, even when the operator operates the surface operation part of the dome-shaped part 18 with the index finger, while putting the thumb and the ring finger that are not supposed to be used for the indication operation on the peripheral area of the surface operation part formed of the dome-shaped part 18 and bringing them into contact with the peripheral area, only the indication operation with the index finger is the detection target and the indication operation in the X-axis direction and the Y-axis direction at the surface operation part of the dome-shaped part 18 with this index finger can be detected accurately and favorably. Thus, the operator can perform the operation with the index finger while putting the thumb and the palm on the periphery of the dome-shaped part 18 at ease, and therefore can perform stable, accurate operation along the X-axis-direction guide part 18bX and the Y-axis-direction guide part 18bY.

In the above description, the output circuit 25 of the operation detecting circuit 20 is explained as a unit that outputs the position indicated by an indicator as two-dimensional coordinate values composed of an X-coordinate value and a Y-coordinate value of the output coordinate space of the sensor 10. However, virtual Z-coordinate values according to the three-dimensional shape of the dome-shaped part 18 may be prepared for the output circuit 25 in association with the combinations of the X-coordinate value and the Y-coordinate value of the area of the dome-shaped part 18, and the output circuit 25 may output these three-dimensional coordinate values (X, Y, Z) as the coordinate values of the position indicated by an indicator.

[Modification Examples of First Embodiment]

The configuration for turning the peripheral area of the dome-shaped part 18 in the sensor 10 to a dead zone in which the indicator is not detected is not limited to the above-described configuration in which the dead-zone-forming sheet 17 is provided. FIGS. 6A to 6D show several other examples of the configuration for turning the peripheral area of the dome-shaped part 18 in the sensor 10 to a dead zone in which the indicator is not detected.

Figure 6A:
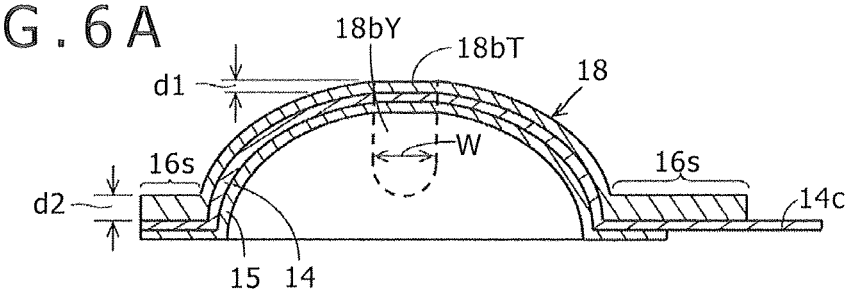
FIGS. 6A to 6D are diagrams for explaining several modification examples of the major parts of the indicator operation detecting device according to the first embodiment of this invention.

In the example of FIG. 6A, the dead-zone-forming sheet 17 is not used. The thickness of the protective sheet 16 is set to a thickness d1 at the part of the dome-shaped part 18 and set to a thickness d2 (d2>d1) at a peripheral area part 16s of the dome-shaped part 18. Due to this, the distance between the surface of the first sheet-shaped substrate 14 and the surface of the protective sheet 16 is set equal to the thickness d2, and this distance is longer than that at the part of the dome-shaped part 18. In the capacitive sensor, it becomes impossible to detect the indicator when the distance between the sensor and the indicator becomes long. Thus, the area part 16s works as a dead zone in which the sensor 10 does not detect the indicator.

Figure 6B:
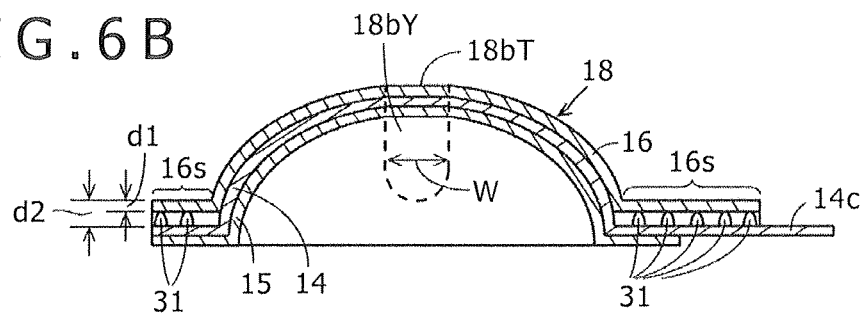

In the example of FIG. 6B, the thickness of the protective sheet 16 is set constant at d1 at both the part of the dome-shaped part 18 and the peripheral area 16s. However, in the peripheral area 16s, spacers 31 having a predetermined height are made to intervene between the first sheet-shaped substrate 14 and the protective sheet 16 so that the distance between the surface of the first sheet-shaped substrate 14 and the surface of the protective sheet 16 may be set equal to the thickness d2. In the case of this example, the intermediary of the spacers 31 provides the state in which an air layer having a thickness (d2−d1) exists between the first sheet-shaped substrate 14 and the protective sheet 16. Due to this configuration, the distance between the surface of the first sheet-shaped substrate 14 and the surface of the protective sheet 16 is set equal to the thickness d2, so that the area part 16s works as a dead zone in which the sensor 10 does not detect the indicator.

Figure 6C:
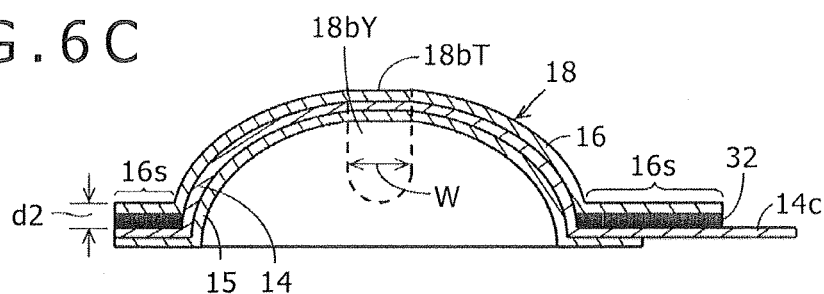

In the example of FIG. 6C, the thickness of the protective sheet 16 is set constant at d1 at both the part of the dome-shaped part 18 and the peripheral area 16s. However, in the peripheral area 16s, a dielectric layer 32 having a predetermined height is inserted between the first sheet-shaped substrate 14 and the protective sheet 16 so that the distance between the surface of the first sheet-shaped substrate 14 and the surface of the protective sheet 16 may be set equal to the thickness d2. Due to this configuration, the distance between the surface of the first sheet-shaped substrate 14 and the surface of the protective sheet 16 is set equal to the thickness d2, so that the area part 16s works as a dead zone in which the sensor 10 does not detect the indicator.

Figure 6D:
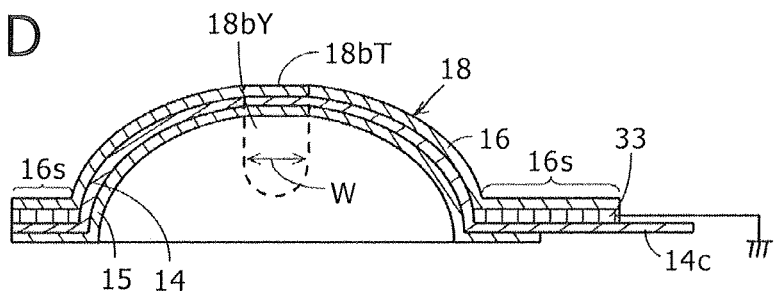

In the example of FIG. 6D, an electrical conductor layer 33 such as a metal layer is inserted between the first sheet-shaped substrate 14 and the protective sheet 16 in the peripheral area 16s of the dome-shaped part 18. However, this electrical conductor layer 33 is insulated from the first electrodes 12 on the surface of the first sheet-shaped substrate 14. This electrical conductor layer 33 is electrically connected to a ground potential as shown in the diagram. According to this configuration, the indicator is not detected in the peripheral area 16s of the dome-shaped part 18 due to the existence of the grounded electrical conductor layer 33. This makes the area part 16s work as a dead zone in which the sensor 10 does not detect the indicator.

Other configuration examples for turning the peripheral area of the dome-shaped part 18 in the sensor 10 to a dead zone in which the indicator is not detected are not limited to the above-described examples of FIGS. 6A to 6D. For example, the following configuration may be employed. Specifically, the coordinate area corresponding to the peripheral area of the dome-shaped part 18 in the sensor 10 is stored in advance. When an indicator is detected by the sensor 10, the detection coordinates of this indicator are ignored or made invalid if the detected coordinate position exists in the coordinate area corresponding to the peripheral area.

In the above-described embodiment, in the X-axis-direction guide part 18bX and the Y-axis-direction guide part 18bY of the second input part 18b of the surface operation part formed of the dome-shaped part 18, the curvature p in the directions perpendicular to the X-axis direction and the Y-axis direction is set to zero across the part of the width W. Thereby, the guide parts 18bX and 18bY are each provided as a band-shaped flat surface such that the contact area with the indicator such as a finger can be large.

Figure 7:
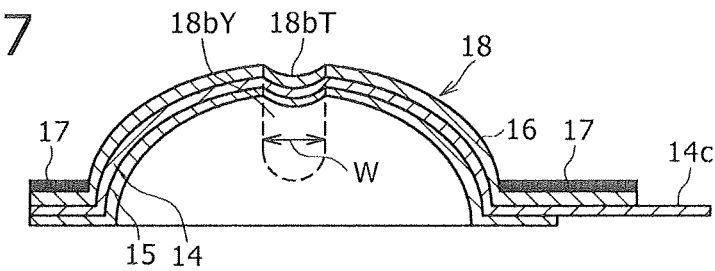
FIG. 7 is a diagram for explaining a modification example of the major parts of the indicator operation detecting device according to the first embodiment of this invention.

However, in the X-axis-direction guide part 18bX and the Y-axis-direction guide part 18bY of the second input part 18b, the shape to provide a large area as the contact area with the indicator such as a finger is not limited thereto. For example, as shown in FIG. 7, each of the X-axis-direction guide part 18bX and the Y-axis-direction guide part 18bY may be so configured as to have a curved surface concave in the direction perpendicular to the X-axis direction and the Y-axis direction. In this case, the curved shape of the concave surface is set to such a shape that the contact area with the ball of the human finger is larger than that when the guide part is a flat surface.

In the case of this example of FIG. 7, because the X-axis-direction guide part 18bX and the Y-axis-direction guide part 18bY have the concave surface shape, linear indication operation in the X-axis direction or the Y-axis direction can be carried out with easy recognition of these X-axis-direction guide part 18bX and Y-axis-direction guide part 18bY in the dome-shaped part 18.

[Second Embodiment]

The second embodiment is a modification example of the first embodiment. Specifically, in the sensor 10 of the above-described first embodiment, the detection sensitivity of the indicator is made the same between the first input part 18a of the dome-shaped part 18 and the second input part 18b composed of the X-axis-direction guide part 18bX and the Y-axis-direction guide part 18bY.

In contrast, in a sensor 10A in a second embodiment to be described below, the detection sensitivity of the indicator is set higher in the second input part 18b than in the first input part 18a in consideration of the fact that linear indication operation in the X-axis direction and the Y-axis direction is important as input operation.

Figure 8A:
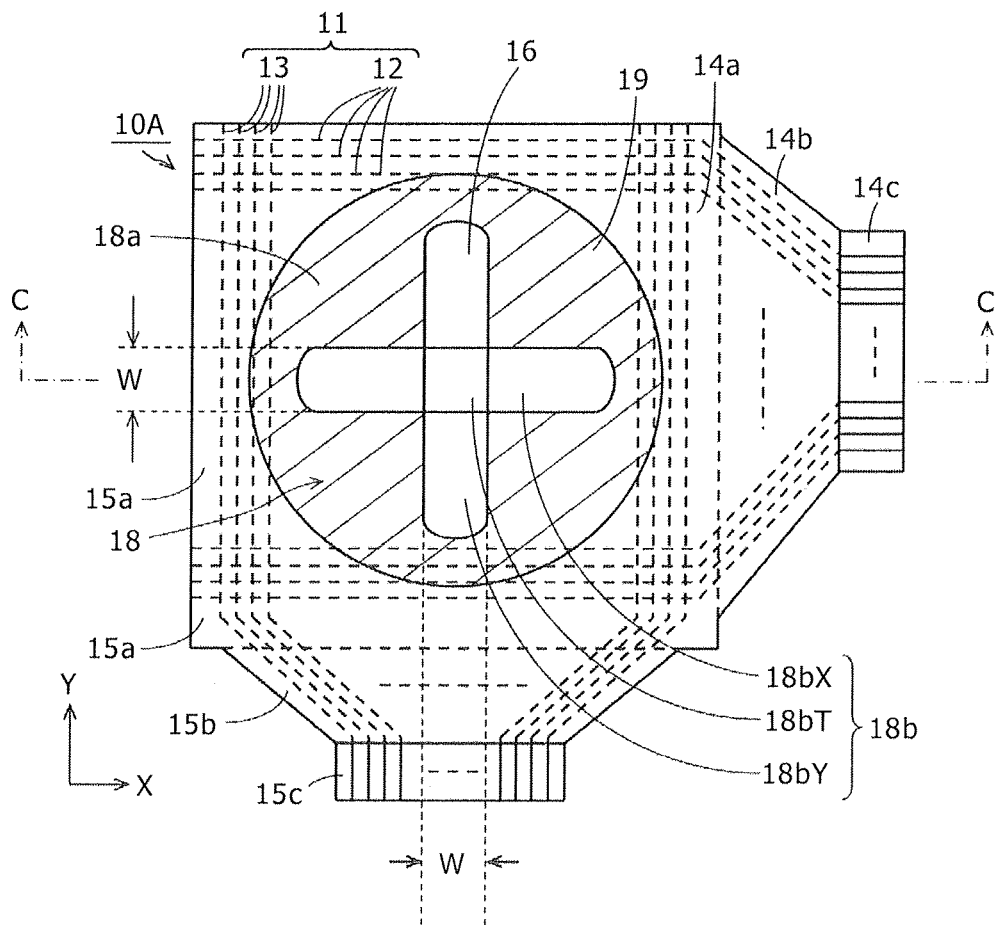
FIGS. 8A and 8B are diagrams for explaining the major parts of an indicator operation detecting device according to a second embodiment of this invention.
Figure 8B:
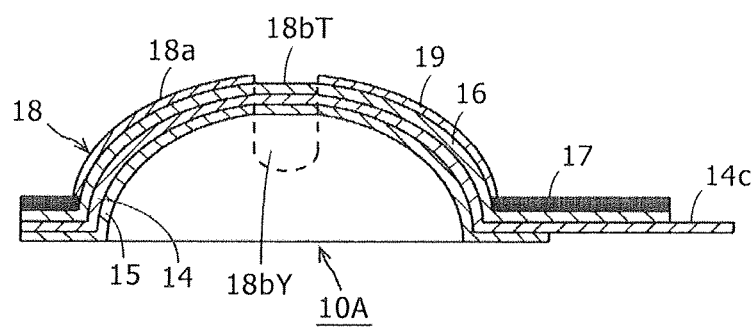

FIGS. 8A and 8B show a configuration example of the sensor 10A in an indicator operation detecting device of this second embodiment. FIG. 8A is a diagram when the sensor 10A is viewed from the side of the surface on which operation is performed by an indicator. FIG. 8B is a sectional view along line C-C in FIG. 8A. The same part in the sensor 10A in this second embodiment as that in the sensor 10 of the first embodiment is given the same reference numeral and detailed description thereof is omitted. The sensor 10A of this second embodiment also has a circuit configuration like that shown in FIG. 1 in the first embodiment and the operation detecting circuit 20 is connected to the sensor 10A exactly as with the sensor 10.

In the dome-shaped part 18 of the sensor 10A in the indicator operation detecting device of this second embodiment, a dielectric sheet 19 for lowering the sensitivity to the indicator is deposited only at the area part of the first input part 18a. The hatched part in FIG. 8A is the part of the dielectric sheet 19. That is, as shown also in FIG. 8B, in the dome-shaped part 18, the dielectric sheet 19 is not deposited at the part configuring the second input part 18b and the surface of the protective sheet 16 is exposed at the second input part 18b.

Therefore, according to this second embodiment, in the dome-shaped part 18, the detection sensitivity of the indicator in the first input part 18a is lower than that in the X-axis-direction guide part 18bX and the Y-axis-direction guide part 18bY configuring the second input part 18b because the dielectric sheet 19 is deposited on the first input part 18a. Thus, the sensor 10A accurately and surely detects linear indication operation in the X-axis direction and the Y-axis direction carried out by tracing of the X-axis-direction guide part 18bX and the Y-axis-direction guide part 18bY by the operator.

In this case, as the dielectric material to configure the dielectric sheet 19, a material having a dielectric constant suitable for the intended degree of lowering of the detection sensitivity of the indicator relative to the detection sensitivity at the X-axis-direction guide part 18bX and the Y-axis-direction guide part 18bY is selected and used.

This sensor 10A is fabricated by being molded in the following manner although not shown in the diagram. Specifically, the steps until the protective sheet 16 described in the first embodiment is bonded onto the second sheet-shaped substrate 15 are the same also in the case of the second embodiment. In the second embodiment, furthermore, on the protective sheet 16, the dielectric sheet 19, which is a circular shape sheet corresponding to the circular area in which the dome-shaped part 18 is formed on this protective sheet 16 and from which the area part corresponding to the X-axis-direction guide part 18bX and the Y-axis-direction guide part 18bY configuring the second input part 18b is cut out, is deposited.

Then, as described above, the dead-zone-forming sheet 17, in which the penetration hole 17a is made corresponding to the circular area in which the dome-shaped part 18 is formed, is deposited on the protective sheet 16 in the state in which the circular area including the dielectric sheet 19 is located in the penetration hole 17a.

Then, in the rectangular areas 14a and 15a of five layers of the sheet members bonded in the above-described manner, the four-layer part of the first sheet-shaped substrate 14, the second sheet-shaped substrate 15, the protective sheet 16, and the dielectric sheet 19 in the circular area corresponding to the penetration hole 17a of the dead-zone-forming sheet 17 is vacuum molded to be turned to the three-dimensional dome-shaped part 18 as shown in the above-described FIG. 3B.

As described above, according to this second embodiment, the detection sensitivity of the indicator at the first input part 18a of the sensor 10A is lower than that at the X-axis-direction guide part 18bX and the Y-axis-direction guide part 18bY of the second input part 18b. Therefore, even when the operator roughly performs operation at the X-axis-direction guide part 18bX and the Y-axis-direction guide part 18bY, the sensor 10A can detect linear indication operation in the X-axis direction and the Y-axis direction by the operator almost accurately and surely.

The forming method of the dielectric sheet 19 is not limited to the example of the above description and the constituent part of the dielectric sheet 19 may be formed by spraying or applying a dielectric material.

Third Embodiment

The above-described first embodiment and second embodiment are the cases in which the surface operation part and the sensor are monolithically configured. Furthermore, the curved shape of the surface operation part is convex in a dome manner. A third embodiment to be described below is a case in which the surface operation part and the sensor are different components and the curved shape of the surface operation part is a concave surface.

Figure 9A:
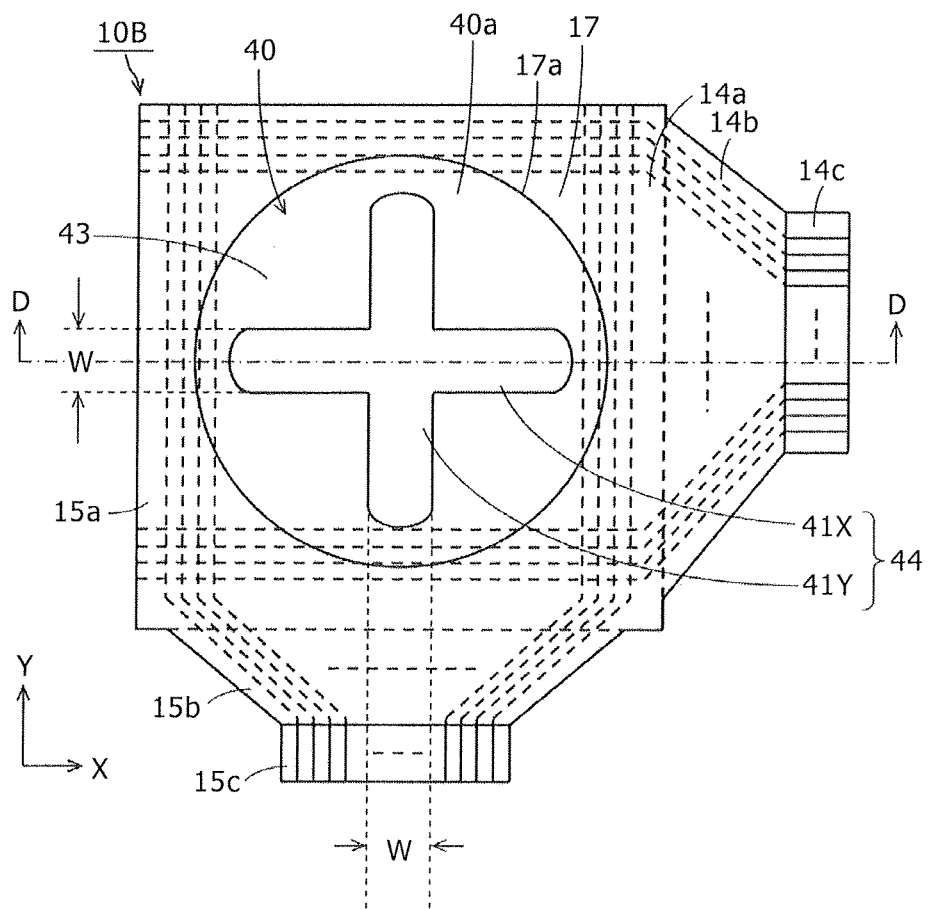
FIGS. 9A and 9B are diagrams for explaining the major parts of an indicator operation detecting device according to a third embodiment of this invention.
Figure 9B:
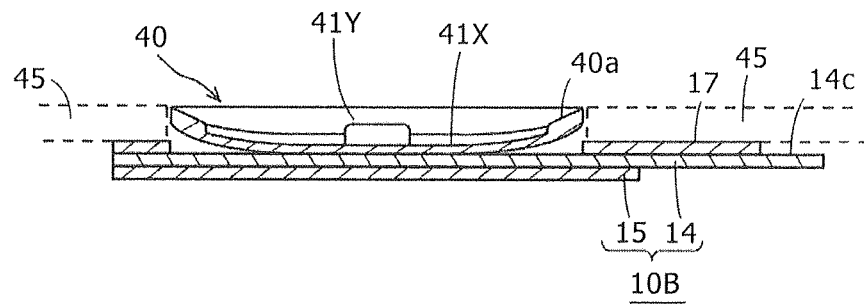

FIGS. 9A and 9B show a configuration example of one example of an indicator operation detecting device according to the third embodiment of this invention. FIG. 9A is a diagram when a sensor 10B of the indicator operation detecting device of this third embodiment is viewed from the side of the surface on which operation is performed by an indicator. FIG. 9B is a sectional view along line D-D in FIG. 9A. Also in this third embodiment, the same part as that in the first embodiment is given the same reference numeral and detailed description thereof is omitted.

Also in the sensor 10B of this third embodiment, the first sheet-shaped substrate 14, the second sheet-shaped substrate 15, and the dead-zone-forming sheet 17 of the sensor 10 of the first embodiment are stacked and bonded in such a manner that the penetration hole 17a of the dead-zone-forming sheet 17 is set at the center position of the rectangular areas 14a and 15a of the first sheet-shaped substrate 14 and the second sheet-shaped substrate 15 as shown in the above-described FIGS. 3A and 3B. However, the protective sheet 16 is deemed to be unnecessary and is not provided in the sensor 10B of this example of FIGS. 9A and 9B. However, the protective sheet 16 may be provided and bonded onto the first sheet-shaped substrate 14 also in this third embodiment, of course.

The sensor 10B of this third embodiment is not subjected to three-dimensional molding and its flat surface shape is kept as it is as shown in FIG. 9B differently from the above-described first embodiment and second embodiment.

In the sensor 10B of this third embodiment, as shown in FIGS. 9A and 9B, a surface operation member 40 formed of a dielectric having a concave surface 40a and a thin, shallow dish shape is provided and bonded by e.g., an adhesive to the circular area corresponding to the penetration hole 17a of the dead-zone-forming sheet 17 over the rectangular areas 14a and 15a of the first sheet-shaped substrate 14 and the second sheet-shaped substrate 15. In this case, the surface operation member 40 is so joined that its bottom on the opposite side to the concave surface 40a is bonded onto the first sheet-shaped substrate 14 by the adhesive. That is, in this third embodiment, the surface operation member 40 serves as the surface operation part and is configured as a component separate from the sensor 10B.

The indicator operation detecting device of this third embodiment has a circuit configuration like that shown in FIG. 1 in the first embodiment and the operation detecting circuit 20 is connected to the sensor 10B exactly as with the sensor 10.

In the concave surface 40a of the surface operation member 40, an X-axis-direction guide part 41X formed of a concave part having a width W is linearly formed along the X-axis direction and a Y-axis-direction guide part 41Y formed of a concave part having the width W is linearly formed along the Y-axis direction. Therefore, a concave part having a cross shape is formed in the concave surface 40a as shown in FIG. 9A.

In this case, the curved shape of the concave part of the X-axis-direction guide part 41X and the Y-axis-direction guide part 41Y of a second input part 44 is set to such a curved shape that the contact area with a human finger when the finger contacts this concave part is larger than that when the finger traces the other area of the concave surface 40a similarly to the above-described second embodiment.

The X-axis-direction guide part 41X and the Y-axis-direction guide part 41Y form the second input part 44 in the surface operation member 40. Of the concave surface 40a of the surface operation member 40, the area except the area of the above-described cross-shaped concave part serves as a first input part 43.

Therefore, the sensor 10B detects indication operation by an indicator in the area except the area corresponding to the area of the above-described cross-shaped concave part, of the circular area corresponding to the concave surface 40a, as indication operation in the first input part 43. The indication operation of tracing the concave surface 40a of this first input part 43 in a circular arc manner is detected as rotational indication or the like similarly to the above-described embodiments.

The sensor 10B detects indication operation by an indicator in the area corresponding to the area of the above-described cross-shaped concave part, of the circular area corresponding to the concave surface 40a, as indication operation in the second input part 44. The indication operation in this second input part 44 is linear indication operation similarly to the above-described embodiments.

In the third embodiment configured in the above-described manner, the operator can feel the second input part 44 configured by the X-axis-direction guide part 41X and the Y-axis-direction guide part 41Y formed of the concave part by touching and tracing the concave surface 40a of the surface operation member 40.

In this case, because the X-axis-direction guide part 41X and the Y-axis-direction guide part 41Y are each formed as a concave part having such a curved surface that the contact area with the finger is larger than that when the finger traces the first input part 43 of the concave surface 40a, the sensor 10B surely detects linear indication operation in the X-axis direction and the Y-axis direction with high sensitivity.

Furthermore, in the case of this third embodiment, the X-axis-direction guide part 41X and the Y-axis-direction guide part 41Y are concave parts formed in the concave surface 40a, and the distance to the first sheet-shaped substrate 14 and the second sheet-shaped substrate 15 of the sensor 10B is shorter than that of the operation surface of the first input part 43 of the concave surface 40a. Therefore, the sensor 10B detects indicator operation at the second input part 44 configured by the X-axis-direction guide part 41X and the Y-axis-direction guide part 41Y with detection sensitivity higher than that of indicator operation at the first input part 43 of the concave surface 40a. Accordingly, even when the operator performs rough indication operation along the X-axis-direction guide part 41X or the Y-axis-direction guide part 41Y as the second input part 44, the sensor 10B surely detects the linear indication operation in the X-axis direction or the Y-axis direction.

Moreover, according to the above-described third embodiment, the dead-zone-forming sheet 17 is provided around the surface operation member 40. Thus, even when the operator contacts the periphery of the surface operation member 40 when performing operation along the X-axis-direction guide part 41X or the Y-axis-direction guide part 41Y, this is not detected as an indicator. Therefore, the operator can carry out indication operation in the surface operation member 40 while putting the thumb and palm on the periphery of the surface operation member 40 at ease, and thus can carry out indication operation such as linear indication operation surely and accurately.

In the sensor 10B, the dead-zone-forming sheet 17 having the penetration hole 17a is bonded onto the first sheet-shaped substrate 14 in order to turn the part other than the circular surface operation member 40 to a dead zone. However, if the sensor 10B of this third embodiment is housed in the chassis of the sensor 10B, the sensor 10B is housed in the chassis in the state in which the surface operation member 40 is surrounded by a plate part 45 as part of the chassis in such a manner that the height of the plate part 45 is equal to or larger than that of the edge of the circular shape of the surface operation member 40 as shown by the dotted line in FIG. 9B. Therefore, even when the operator contacts the chassis outside the surface operation member 40, the sensor 10B can be prevented from detecting the operation due to the existence of the plate part 45 as part of this chassis. In this case, the dead-zone-forming sheet 17 does not have to be provided.

It is also possible to apply the above-described second embodiment to the above-described third embodiment. Specifically, in the second embodiment, the part of the first input part 18a except the second input part 18b of the dome-shaped part 18 having a convex shape is covered by a dielectric sheet. Also in this third embodiment, only the area part of the first input part 43 of the concave surface 40a is so formed as to be covered by a dielectric sheet so that the indicator detection sensitivity at the first input part 43 may be set lower than that at the second input part 44.

Fourth Embodiment

This fourth embodiment is a modification example of the third embodiment. The same part as that in the third embodiment is given the same reference numeral, and detailed description thereof is omitted.

This fourth embodiment is an example in which the configuration is so made that the X-axis-direction guide part 41X or the Y-axis-direction guide part 41Y of the second input part 44 formed in the concave surface 40a can be recognized more easily even when indication operation is performed while the screen is viewed, i.e., without the user viewing the surface operation part.

Figure 10A:
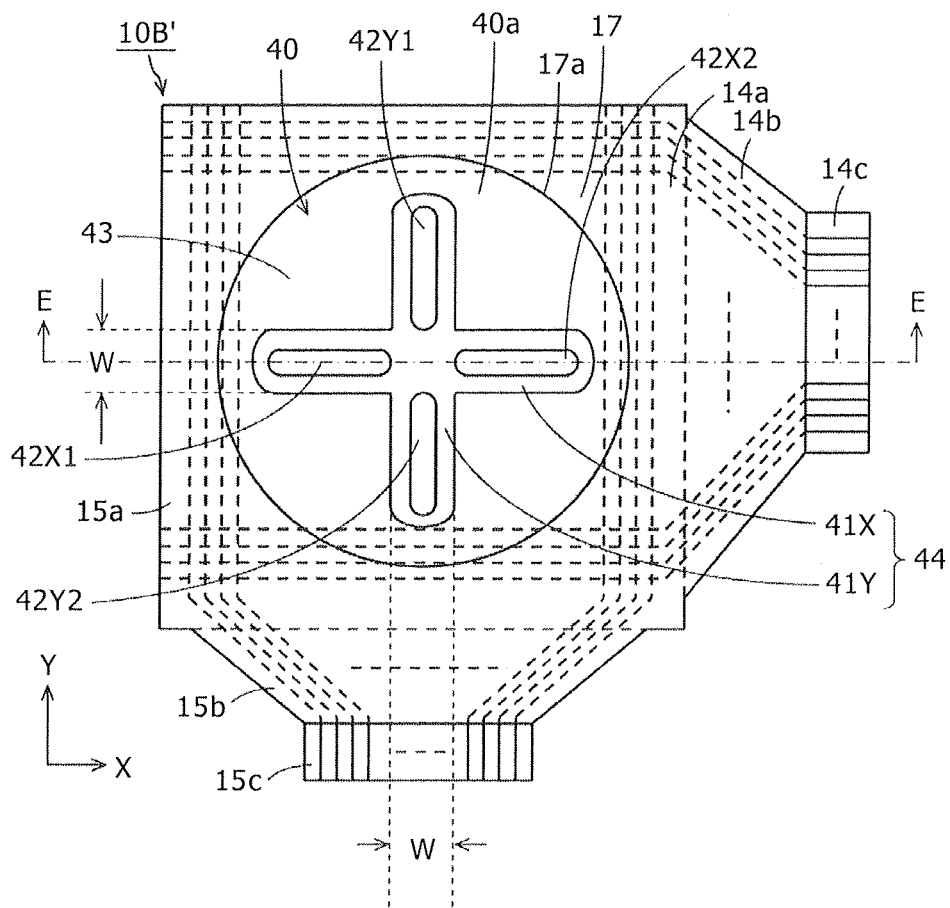
FIGS. 10A and 10B are diagrams for explaining the major parts of an indicator operation detecting device according to a fourth embodiment of this invention.
Figure 10B:
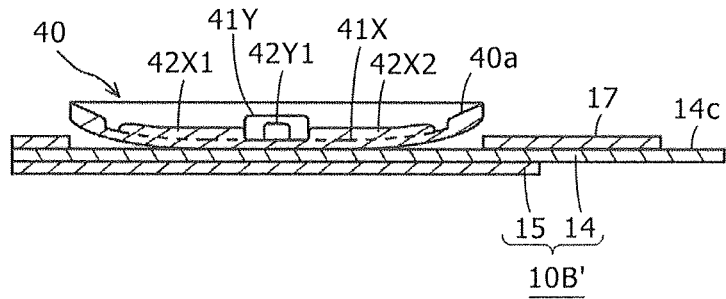

FIGS. 10A and 10B show a configuration example of a sensor 10B' of this fourth embodiment. Specifically, in this fourth embodiment, as shown in FIG. 10A, linear, small-width ridges 42X1 and 42X2 are formed along the X-axis direction in the X-axis-direction guide part 41X formed of a concave part, and linear, small-width ridges 42Y1 and 42Y2 are formed along the Y-axis direction in the Y-axis-direction guide part 41Y formed of a concave part. In this example, the height of these ridges 42X1, 42X2, 42Y1, and 42Y2 is so set as not to be larger than that of the other part of the concave surface 40a as shown in FIG. 10B, which is a sectional view along line E-E in FIG. 10A. Of course, these ridges 42X1, 42X2, 42Y1, and 42Y2 may be set slightly higher than the other part of the concave surface 40a.

Therefore, in this fourth embodiment, the X-axis-direction guide part 41X having the ridges 42X1 and 42X2 and the Y-axis-direction guide part 41Y having the ridges 42Y1 and 42Y2 form the second input part 44 in the surface operation member 40.

In this fourth embodiment, the operator can carry out linear indication operation in the X-axis direction and the Y-axis direction by using, as a clue, the ridges 42X1 and 42X2 and the ridges 42Y1 and 42Y2 formed in the X-axis-direction guide part 41X and the Y-axis-direction guide part 41Y.

Furthermore, in this fourth embodiment, the operator can accurately carry out linear indication operation in the X-axis direction or the Y-axis direction by performing operation of tracing the ridges 42X1 and 42X2 or the ridges 42Y1 and 42Y2.

Moreover, in this fourth embodiment, the ridges 42X1 and 42X2 and the ridges 42Y1 and 42Y2 are formed in the X-axis-direction guide part 41X and the Y-axis-direction guide part 41Y as concave parts formed in the concave surface 40a. Therefore, differently from the case of the outer surface of the dome-shaped part 18 having a convex shape, when operation is performed by a finger, the finger easily contacts also the X-axis-direction guide part 41X and the Y-axis-direction guide part 41Y around the ridges 42X1 and 42X2 and the ridges 42Y1 and 42Y2, and the contact area of the finger is large. This alleviates interruption of the detection output, which frequently occurs when protrusions are formed on the outer surface of the dome-shaped part 18 having a convex surface like in the sensor 10EX of the comparative example shown in FIGS. 5A and 5B.

In the above-described fourth embodiment, the ridges 42X1 and 42X2 along the X-axis direction and the ridges 42Y1 and 42Y2 along the Y-axis direction are provided in the X-axis-direction guide part 41X and the Y-axis-direction guide part 41Y formed of concave parts having the width W in the second input part 44. However, without providing the X-axis-direction guide part 41X and the Y-axis-direction guide part 41Y, only the ridges 42X1 and 42X2 along the X-axis direction and the ridges 42Y1 and 42Y2 along the Y-axis direction may be provided on the concave surface 40a as guides for linear indication in the X-axis direction and the Y-axis direction.

Fifth Embodiment

In the sensors 10, 10A, 10B, and 10B' used in the indicator operation detecting devices of the above-described first to fourth embodiments, the plural first electrodes 12 and the plural second electrodes 13 are formed along the directions corresponding with the X-axis direction and the Y-axis direction of the output coordinate space of the sensor, perpendicular to each other. In addition, the lead area 14b and the lead area 15b are formed along the X-axis direction and the Y-axis direction perpendicular to each other, which are the extension directions of the plural first electrodes 12 and the plural second electrodes 13.

Therefore, as shown in FIGS. 2A to 2D, 8A and 8B, 9A and 9B, and 10A and 10B, the shape of the indicator operation detecting device as a whole includes the lead area 14b and the lead area 15b on one side in the X-axis direction and one side in the Y-axis direction, respectively, of the surface operation part with a three-dimensional shape, which is formed of the dome-shaped part 18 or the surface operation member 40 having the concave surface 40a.

This causes the sensors 10, 10A, 10B, and 10B' to have a shape in which the lead area 14b exists only on one side in the X-axis direction and the lead area 15b exists only on one side in the Y-axis direction. Thus, these sensors have an asymmetric shape both when the X-axis direction is defined as the axis of symmetry and when the Y-axis direction is defined as the axis of symmetry.

By the way, if the indicator operation detecting device according to the embodiment of this invention is housed in a chassis, it is desirable that the left and right areas and/or the upper and lower areas of the surface operation part having a three-dimensional shape have the same size when the design is considered.

However, as described above, the sensors 10, 10A, 10B, and 10B' of the above-described first to fourth embodiments have an asymmetric shape about both the X-axis direction and the Y-axis direction. Therefore, if a design shape symmetric about both the X-axis direction and the Y-axis direction is made, at least useless spaces having the same sizes as those of the lead area 14b and the lead area 15b are necessary on the upper or lower side of the surface operation part and the left or right side thereof. Therefore, the size of the chassis to house the indicator operation detecting device may undesirably increase. In recent years, along with size reduction of an apparatus, it is desirable that size reduction of the indicator operation detecting device can also be achieved by reducing the useless space as much as possible. However, it is difficult to meet this goal.

A fifth embodiment is a solution to the above-described problem. In this fifth embodiment, the indicator operation detecting device is so configured as to be capable of having a symmetric shape to thereby realize size reduction.

Figure 11A:
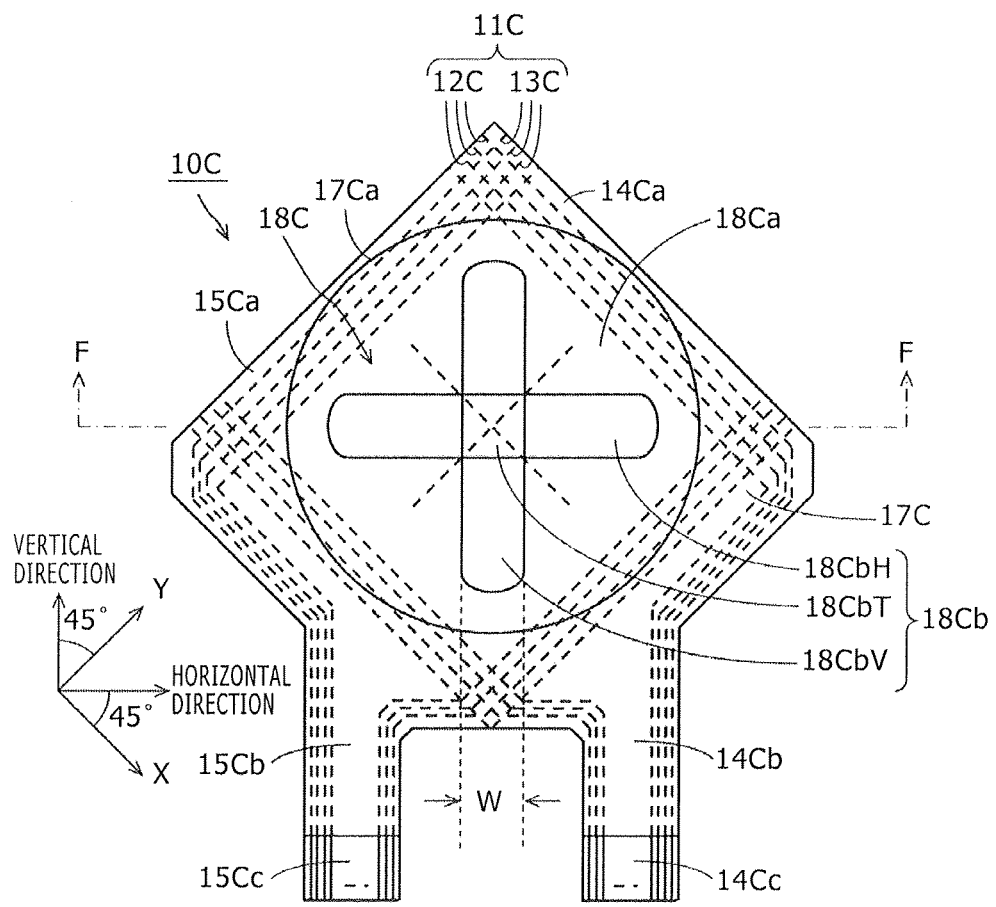
FIGS. 11A and 11B are diagrams for explaining the major parts of an indicator operation detecting device according to a fifth embodiment of this invention.
Figure 11B:
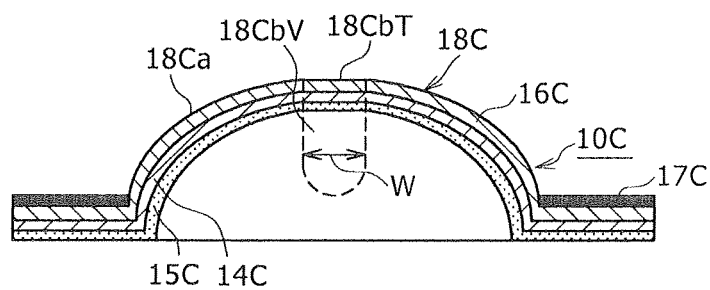

FIGS. 11A and 11B are diagrams showing a configuration example of the major parts of the indicator operation detecting device according to the fifth embodiment, and shows a sensor 100 with which a surface operation part is formed monolithically. These FIGS. 11A and 11B correspond to a configuration obtained by applying this fifth embodiment to the indicator operation detecting device of the first embodiment. That is, in this fifth embodiment, in the sensor 100, the surface operation part is monolithically formed and is molded into a dome-shaped part similarly to the first embodiment.

FIG. 11A is a diagram when the sensor 10C of the indicator operation detecting device of this fifth embodiment is viewed from the side of the surface on which operation is performed by an indicator. FIG. 11B is a sectional view along line F-F in FIG. 11A. Also in this fifth embodiment, the same part as that in the first embodiment is given the same reference numeral, and detailed description thereof is omitted.

As shown in FIG. 11B, the sensor 100 of this example has a four-layer structure composed of a first sheet-shaped substrate 14C, a second sheet-shaped substrate 15C, a protective sheet 16C, and a dead-zone-forming sheet 17C similarly to the sensor 10 of the first embodiment. All of these first sheet-shaped substrate 14C, second sheet-shaped substrate 15C, protective sheet 16C, and dead-zone-forming sheet 17C are formed by a dielectric material.

The first sheet-shaped substrate 14C and the second sheet-shaped substrate 15C include rectangular areas 14Ca and 15Ca similarly to the first sheet-shaped substrate 14 and the second sheet-shaped substrate 15 of the first embodiment. In the rectangular area 14Ca of the first sheet-shaped substrate 14C, plural first electrodes 12C are formed in parallel to each other along a first direction. In the rectangular area 15Ca of the second sheet-shaped substrate 15C, plural second electrodes 13C are formed in parallel to each other along a second direction intersecting the first direction. The first sheet-shaped substrate 14C and the second sheet-shaped substrate 15C are so bonded that the rectangular area 14Ca and the rectangular area 15Ca overlap with each other. This forms an electrode group 11C in the rectangular area in which the rectangular area 14Ca and the rectangular area 15Ca overlap with each other.

Also in the sensor 10C of this fifth embodiment, the first direction, along which the first electrodes 12C are formed, is defined as the X-axis direction of the output coordinate space of the sensor 100, and the direction along which the second electrodes 13C are formed is defined as the Y-axis direction.

However, in the sensor 10C of this fifth embodiment, the X-axis direction and the Y-axis direction of its output coordinate space are so set as to be inclined at 45 degrees from the horizontal direction and the vertical direction of operation by the operator. That is, in the sensor 100, the square rectangular area formed of the overlapping between the rectangular area 14Ca of the first sheet-shaped substrate 14C and the rectangular area 15Ca of the second sheet-shaped substrate 15C is disposed into a rhombic shape obtained by inclining this square by 45 degrees relative to the horizontal direction or the vertical direction of operation by the operator as shown in FIG. 11A.

Furthermore, in the sensor 100 of this fifth embodiment, a lead area 14Cb of the first sheet-shaped substrate 14C and a lead area 15Cb of the second sheet-shaped substrate 15C are both led out from the rectangular areas 14Ca and 15Ca to the same side in one of the horizontal direction and the vertical direction of operation by the operator, specifically the vertical direction in the example of FIGS. 11A and 11B. Specifically, the lead area 14Cb and the lead area 15Cb are formed into a shape like leg parts led out from two adjacent sides of the square rectangular area formed of the overlapping between the rectangular areas 14Ca and 15Ca to the same side in the vertical direction with an inclination of 45 degrees from each of these two sides.

Lead patterns for connecting each of the plural first electrodes 12C and the plural second electrodes 13C to an external circuit section are formed in the lead area 14Cb and the lead area 15Cb, and external connection parts 14Cc and 15Cc are formed at the tip parts of the lead areas 14Cb and 15Cb, similarly to the above description. The shape of the protective sheet 16C is also set to a shape in which two leg parts are led out from a rectangular area having a rhombic shape as shown in FIG. 11A similarly to the first sheet-shaped substrate 14C and the second sheet-shaped substrate 15C. The dead-zone-forming sheet 17 has a similar shape having the penetration hole 17Ca corresponding to the circular area in which a dome-shaped part 18C to be described later is formed.

These first sheet-shaped substrate 14C, second sheet-shaped substrate 15C, protective sheet 16C, and dead-zone-forming sheet 17C are so bonded that their shapes overlap with each other similarly to those shown in the above-described FIGS. 3A and 3B. However, conductor patterns are exposed for connection at the external connection part 14Cc at the tip part of the lead area 14Cb and the external connection part 15Cc at the tip part of the lead area 15Cb.

Furthermore, the circular area corresponding to the penetration hole 17Ca of the dead-zone-forming sheet 17C is vacuum molded to form the dome-shaped part 18C similarly to the first embodiment.

In this case, by this vacuum molding, simultaneously a surface operation part similar to that of the first embodiment is formed in the dome-shaped part 18C. That is, a first input part 18Ca having a curved surface according to the dome shape is formed, and a second input part 18Cb is formed. However, in this fifth embodiment, the second input part 18Cb is composed of a horizontal guide part 18CbH and a vertical guide part 18CbV. The horizontal guide part 18CbH has a width W and is linearly formed into a band shape along the horizontal direction of operation by the operator, inclined at 45 degrees from the X-axis direction of the output coordinate space of the sensor 100. The vertical guide part 18CbV has the width W and is linearly formed into a band shape along the vertical direction of operation by the operator, inclined at 45 degrees from the Y-axis direction.

In this example, in the horizontal guide part 18CbH, the curvature p is set to zero (not a curve but a straight line) across the part of the width W in the direction perpendicular to the forming direction of its linear band shape so that the operator can distinguish the horizontal guide part 18CbH from the curved surface of the first input part 18Ca based on the touch sensation (see FIG. 11B). Similarly, in the vertical guide part 18CbV, the curvature p is set to zero across the part of the width W in the direction perpendicular to the forming direction of its linear band shape (see FIG. 11B). Therefore, a top part 18CbT of the dome-shaped part 18C, at which the horizontal guide part 18CbH and the vertical guide part 18CbV intersect, is a flat square surface whose four sides each have the length W (see FIG. 11B).

In this fifth embodiment, the horizontal direction and the vertical direction of operation by the operator, i.e., the linear directions of the horizontal guide part 18CbH and the vertical guide part 18CbV, are inclined at 45 degrees from the X-axis direction and the Y-axis direction of the output coordinate space of the sensor 100. So, in this example, in an operation detecting circuit 20C to which the sensor 100 is connected, the X and Y coordinates of the position of an indicator detected by the electrode group 11 of the sensor 100 are converted to coordinate values of the coordinate space whose coordinate axes are the horizontal direction and the vertical direction of operation by the operator and these coordinate values are output.

Figure 12:
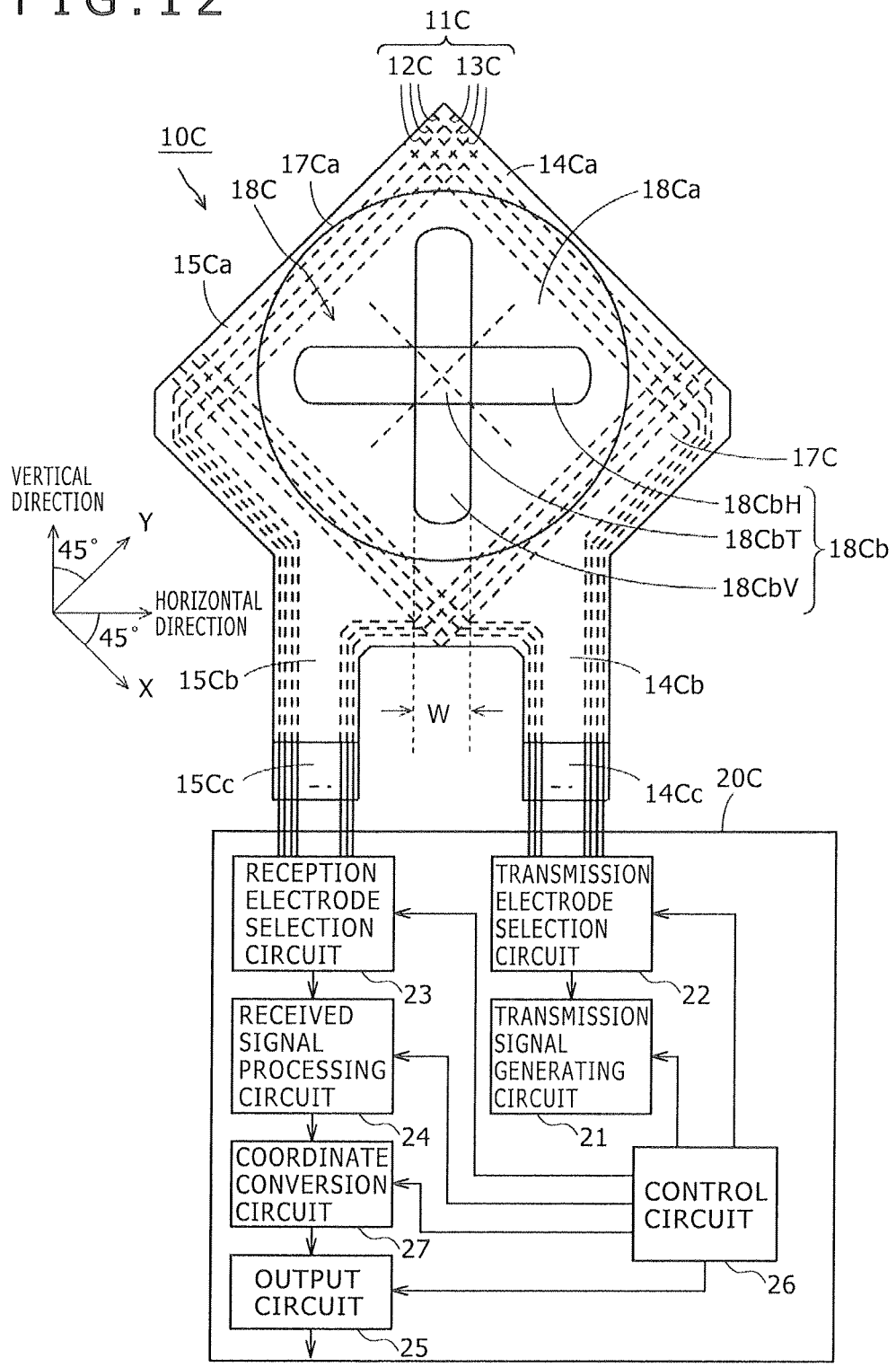
FIG. 12 is a diagram for explaining the connection relationship between a sensor and an operation detecting circuit in the indicator operation detecting device according to the fifth embodiment of this invention.

FIG. 12 is a block diagram for explaining a configuration example of the operation detecting circuit 20C in this fifth embodiment. In this FIG. 12, the same part as that in the operation detecting circuit 20 shown in FIG. 1 is given the same reference numeral, and detailed description thereof is omitted.

Specifically, as shown in FIG. 12, the operation detecting circuit 20C in this fifth embodiment includes a coordinate conversion circuit 27 between the received signal processing circuit 24 and the output circuit 25. The other configuration is the same as that of the operation detecting circuit 20 shown in FIG. 1.

The coordinate conversion circuit 27 is a circuit that converts position coordinates of the X-axis direction and the Y-axis direction of the output coordinate space of the sensor 100 to position coordinates of the horizontal direction and the vertical direction of operation, which are the linear directions of the horizontal guide part 18CbH and the vertical guide part 18CbV. This coordinate conversion circuit 27 can be configured by e.g., a correspondence table (coordinate conversion table) between the position coordinates of the X-axis direction and the Y-axis direction of the output coordinate space of the sensor 100 and the position coordinates of the coordinate space of the horizontal direction and the vertical direction of operation, inclined at 45 degrees from the X-axis direction and the Y-axis direction. This coordinate conversion table can be stored in a memory such as a ROM.

In this example, the coordinate conversion circuit 27 uses X and Y position coordinates of the indication operation position of an indicator from the received signal processing circuit 24 as reference information to read out position coordinates of the coordinate space of the horizontal direction and the vertical direction of operation from the coordinate conversion table and output the read out position coordinates. The output circuit 25 outputs, to an external circuit, the coordinate output in the coordinate space of the horizontal direction and the vertical direction of operation from this coordinate conversion circuit 27.

The coordinate conversion circuit 27 may have a circuit configuration that obtains, by function calculation, coordinate values of the coordinate space of the horizontal direction and the vertical direction of operation, inclined at 45 degrees from the X-axis direction and the Y-axis direction, from X- and Y-coordinate values of the output coordinate space of the sensor 100 from the received signal processing circuit 24, instead of using the above-described coordinate conversion table.

The coordinate conversion circuit 27 may prepare, in the coordinate conversion table, coordinate values of the coordinate axis in the virtual height direction according to the three-dimensional shape of the dome-shaped part 18C in association with the combinations of the X-coordinate value and the Y-coordinate value of the area of the dome-shaped part 18C, and may output the coordinate values (horizontal coordinate value, vertical coordinate value, height-direction coordinate value) from the operation detecting circuit 20C as the detected position coordinates of an indicator.

When the indicator operation detecting device is used as a peripheral device for an apparatus, the apparatus typically includes a software program, a so-called driver, which enables the apparatus to receive and utilize the output from the output circuit 25. The functions of the coordinate conversion circuit 27 may be incorporated in this software program (i.e., the driver).

In this case, as the operation detecting circuit for the sensor 100, the operation detecting circuit 20 shown in FIG. 1 can be used as it is, instead of using the operation detecting circuit 20C like the example of FIG. 12.

Conversely, when the indicator operation detecting device of the embodiment is equipped with the operation detecting circuit 20C including the coordinate conversion circuit 27, the software program of the driver embedded in the counterpart device may be a conventional, general-purpose one that processes output coordinate values of the output coordinate space wherein the X-axis direction and the Y-axis direction correspond with the horizontal direction and the vertical direction of operation.

The above-described fifth embodiment has the same configuration as that of the first embodiment except for that the horizontal direction and the vertical direction of operation by the operator are inclined at 45 degrees from the X-axis direction and the Y-axis direction of the output coordinate space of the sensor 100. Therefore, according to the indicator operation detecting device of the fifth embodiment, exactly as with the first embodiment, the operator can carry out linear indication operation in the horizontal direction corresponding to the horizontal direction of the display screen by performing operation along the horizontal guide part 18CbH while distinguishing between the first input part 18Ca and the second input part 18Cb. Furthermore, the operator can carry out linear indication operation in the vertical direction corresponding to the vertical direction of the display screen by performing operation along the vertical guide part 18CbV. With the first input part 18Ca, the operator can carry out rotational indication operation by performing operation of tracing the curved surface in a circular pattern with a finger.

In addition, in this fifth embodiment, the lead areas 14Cb and 15Cb of the sensor 100 are allowed to be formed on the same side in the vertical direction of operation in this example by inclining the X-axis direction and the Y-axis direction of the output coordinate space of the sensor 100 by 45 degrees relative to the horizontal direction and the vertical direction of operation.

Specifically, as is apparent also from FIG. 11A, the lead area 14Cb and the lead area 15Cb are formed from two sides adjacent to each other along the horizontal direction of operation, of the rectangular areas 14Ca and 15Ca overlapping with each other, into a shape like leg parts on the same side in the vertical direction with an inclination of 45 degrees from these two sides. The existence positions of these lead area 14Cb and lead area 15Cb fall within the range of the length of the diagonal of the rectangular areas 14Ca and 15Ca overlapping with each other along the horizontal direction of operation. Therefore, the size of the sensor 100 in the horizontal direction of operation by the operator can be set almost equal to the length of the diagonal of the rectangular areas 14Ca and 15Ca overlapping with each other along this horizontal direction. Thus, the size of the sensor 100 at least in the horizontal direction can be set small.

Furthermore, as shown in FIG. 11A, the sensor 100 can be given a line-symmetric shape about the diagonal of the rhombic rectangular areas 14Ca and 15Ca overlapping with each other along the vertical direction of operation, including the lead areas 14Cb and 15Cb, which are so formed as to be led out from two sides adjacent to each other along the horizontal direction, of the rectangular areas 14Ca and 15Ca. Thus, by taking advantage of the feature that the sensor 100 of this embodiment has the small-size, line-symmetric (laterally symmetric) shape, the shape of the chassis to house this sensor 100 can also be set to a small-size, line-symmetric shape, so that a small-size, design-wise desirable shape can be obtained.

It is obvious that the effect obtained by inclining the X-axis direction and the Y-axis direction of the output coordinate space of the sensor 100 by 45 degrees relative to the horizontal direction and the vertical direction of operation in this fifth embodiment is achieved also in an indicator operation detecting device that does not have a surface operation part like that of the above-described embodiment.

A description will be made below about an example of the indicator operation detecting device configured as e.g., a tablet device or an independent peripheral device for a PC by taking advantage of the above-described feature of the sensor 100 of the fifth embodiment, i.e., its small-size, line-symmetric shape.

Figure 13:
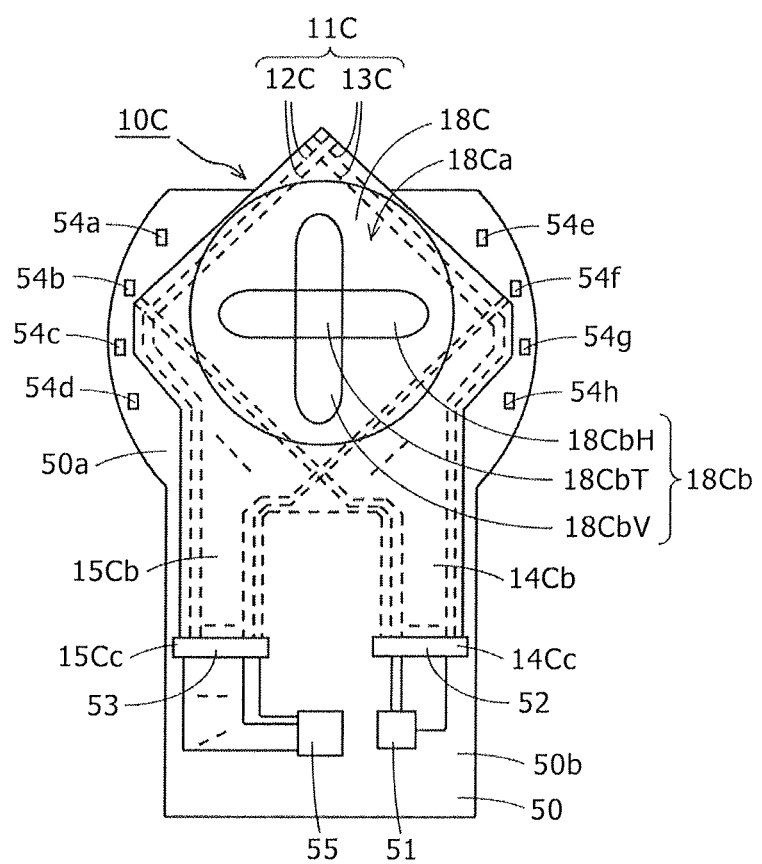
FIG. 13 is a diagram for explaining the major parts of the indicator operation detecting device according to the fifth embodiment of this invention.
Figure 14C:
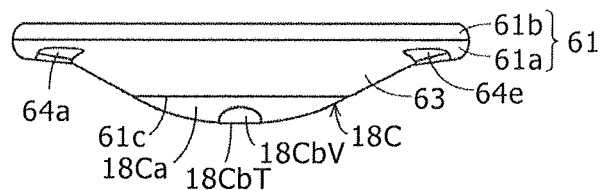
FIGS. 14A to 14D are diagrams for explaining the appearance of the indicator operation detecting device according to the fifth embodiment of this invention.
Figure 14A:
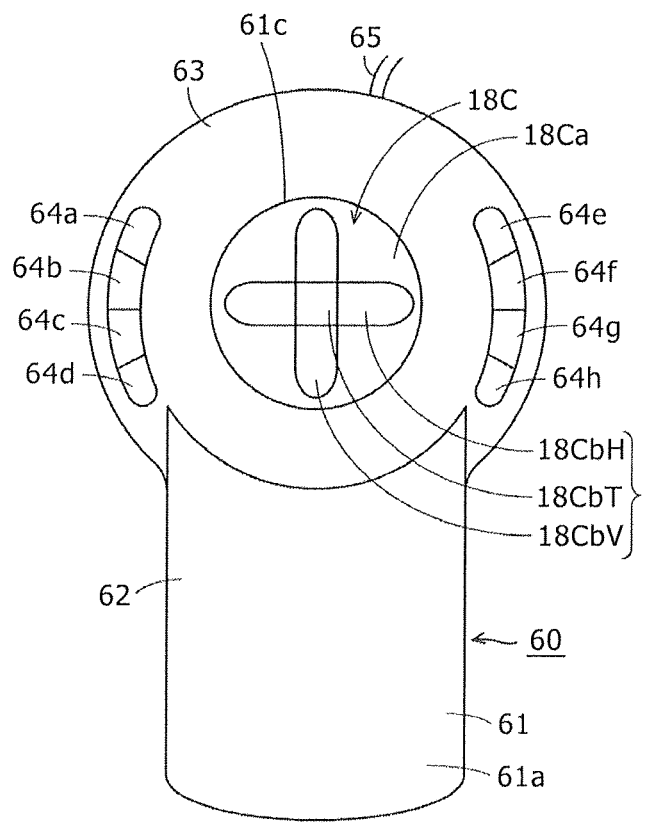
Figure 14D:
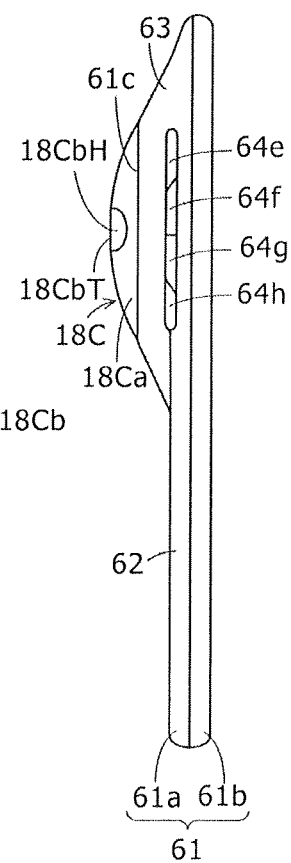
Figure 14B:
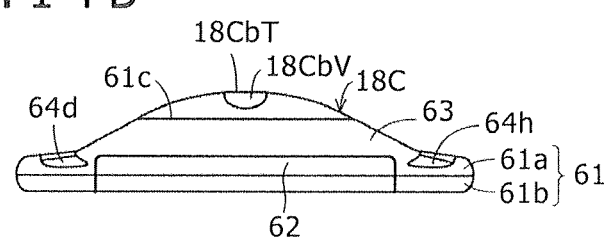

FIG. 13 is a diagram showing the state in which the sensor 100 shown in FIGS. 11A and 11B, with which the surface operation part is formed monolithically, is disposed on a printed board 50. FIGS. 14A to 14D are diagrams showing the appearance of an indicator operation detecting device 60 of the fifth embodiment in which the printed board shown in FIG. 13, on which the sensor 100 is mounted, is housed inside a chassis. FIG. 14A is a front view when the indicator operation detecting device 60 is viewed along the direction perpendicular to the printed board 50. FIG. 14B is a bottom view of the indicator operation detecting device 60. FIG. 14C is a top view of the indicator operation detecting device 60, and FIG. 14D is a right side view of the indicator operation detecting device 60. Because the indicator operation detecting device 60 is laterally symmetric, the left side view is symmetrically represented with respect to the right side view of FIG. 14D.

As shown in FIG. 13, the printed board 50 is composed of a circular area 50*a* having such a size that the rhombic rectangular areas 14Ca and 15Ca of the sensor 100 can be set within the area inside it and a rectangular area 50*b* on which the lead areas 14Cb and 15Cb of the sensor 100 are disposed and the necessary circuit components are mounted.

In the circular area 50*a* of the printed board 50, the rhombic rectangular areas 14Ca and 15Ca of the sensor 100 are disposed. In addition, around these rhombic rectangular areas 14Ca and 15Ca, plural push button switches 54*a* to 54*h* are provided, to which various setting functions associated with indication operation by the indicator can be assigned.

In the rectangular area 50*b* of the printed board 50, the external connection part 14Cc at the tip of the lead area 14Cb of the sensor 100 is connected to a connector part 52 connected to a circuit component 51 and the external connection part 15Cc at the tip of the lead area 15Cb of the sensor 100 is connected to a connector part 53 connected to a circuit component 55. Although not shown in the diagram, other circuit components are provided in the rectangular area 50*b* of the printed board 50 and circuit components are mounted also on the back surface side of the printed board 50 according to need.

The printed board 50 on which the sensor 100 and other components are mounted in the above-described manner is housed in a chassis 61 of the indicator operation detecting device 60 shown in FIGS. 14A to 14D. The chassis 61 is composed of an upper half 61*a* and a lower half 61*b* as shown in FIGS. 14B, 14C, and 14D. The upper half 61*a* and the lower half 61*b* have a shape that is similar to and larger than that of the printed board 50 so that the printed board 50 may be housed inside them. The printed board 50 is housed in the lower half 61*b* and the upper half 61*a* is engaged with the lower half 61*b*. Thereby, the printed board 50 is housed in the chassis 61.

The upper half 61*a* has a penetration hole 61*c* for exposing the dome-shaped part 18C of the sensor 100 to the external. When the upper half 61*a* is engaged with the lower half 61*b*, the dome-shaped part 18C is exposed and projected from the penetration hole 61*c* in the state in which at least the entire second input part 18Cb composed of the horizontal guide part 18CbH and the vertical guide part 18CbV is exposed to the external as shown in FIG. 14A.

A ring-shaped sloping part 63 is made around the penetration hole 61*c* of the upper half 61*a*. In this ring-shaped sloping part 63 of the upper half 61a, plural operation elements 64a to 64h for pressing-down operation of the push button switches 54a to 54h disposed around the rectangular areas 14Ca and 15Ca of the sensor 100 in the circular area 50a of the printed board 50 are formed. Various setting functions associated with or relating to indication operation by the indicator can be assigned to the pressing-down operation of the push button switches 54a to 54h by these plural operation elements 64a to 64h in a tablet device or a PC to which the indicator operation detecting device of this embodiment is connected.

The indicator operation detecting device 60 of this example is connected to the tablet device or PC by a cable 65. The indicator operation detecting device 60 may be wirelessly connected to the tablet device or PC.

With the indicator operation detecting device 60 of the fifth embodiment configured in the above-described manner, the operator can carry out indication operation in the sensor 100 by operating the dome-shaped part 18C exposed from the chassis 61 with a finger. Furthermore, linear indication in the horizontal direction and the vertical direction can be made easily and surely by using the horizontal guide part 18CbH and the vertical guide part 18CbV as a guide similarly to the first embodiment.

In addition, the indicator operation detecting device 60 of the fifth embodiment has a line-symmetric shape whose axis of symmetry is the vertical direction as shown in FIG. 14A. Thus, it has a small size and is design-wise desirable. Moreover, disposing the sensor 100 into a rhombic shape allows the indicator operation detecting device 60 of the fifth embodiment to have also an advantage that plural push button switches relating to indication operation in the sensor 100 can be disposed around the dome-shaped part 18C of the indicator operation detecting device 60 although it has the small size.

In the above-described fifth embodiment, the sensor 100 and the indicator operation detecting device 60 are so configured that the vertical direction is the axis of symmetry. However, it is also possible that the sensor 100 and the indicator operation detecting device 60 are so configured that the horizontal direction is the axis of symmetry.

Although the above-described sensor 100 has a configuration similar to that of the first embodiment, the second embodiment may be employed to set the indicator detection sensitivity at the first input part 18Ca lower than that at the second input part 18Cb. Furthermore, in the horizontal guide part 18CbH and the vertical guide part 18CbV configuring the second input part 18Cb, the surface shape along the direction perpendicular to the longitudinal direction thereof may be set not as a flat surface but as a concave surface.

In the above-described embodiment, the dead-zone-forming sheet 17C is deposited for the sensor 10C in order to turn the area around the dome-shaped part 18C to a dead zone in which the indicator is not detected. However, the dead-zone-forming sheet 17C does not have to be provided because the area around the dome-shaped part 18C of the sensor 100 is covered by the sloping part 63 of the chassis 61.

In the above-described fifth embodiment, the first sheet-shaped substrate 14C and the second sheet-shaped substrate 15C are each given a shape in which two leg parts along the same direction, i.e., the vertical direction, are extended from the rectangular area. However, the first sheet-shaped substrate 14C may be shaped to include one leg part at which the lead area 14Cb is formed and the second sheet-shaped substrate 15C may be shaped to include one leg part at which the lead area 15Cb is formed.

Sixth Embodiment

A sixth embodiment is also an embodiment aiming at size reduction similarly to the fifth embodiment. This sixth embodiment is an example of the case in which a sensor and a surface operation part are configured as separate components similarly to the third embodiment.

Figure 15A:
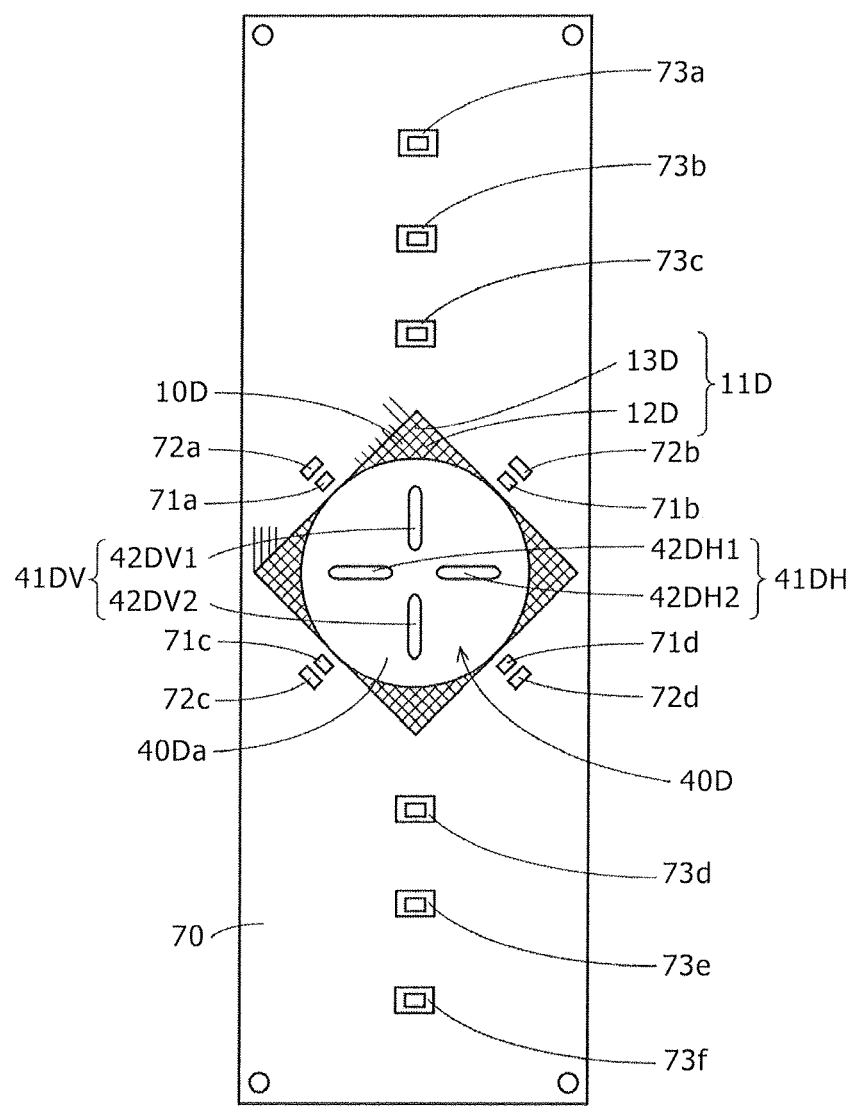
FIGS. 15A and 15B are diagrams for explaining the major parts of an indicator operation detecting device according to a sixth embodiment of this invention.
Figure 15B:
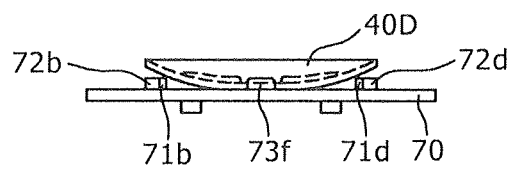
Figure 16A:
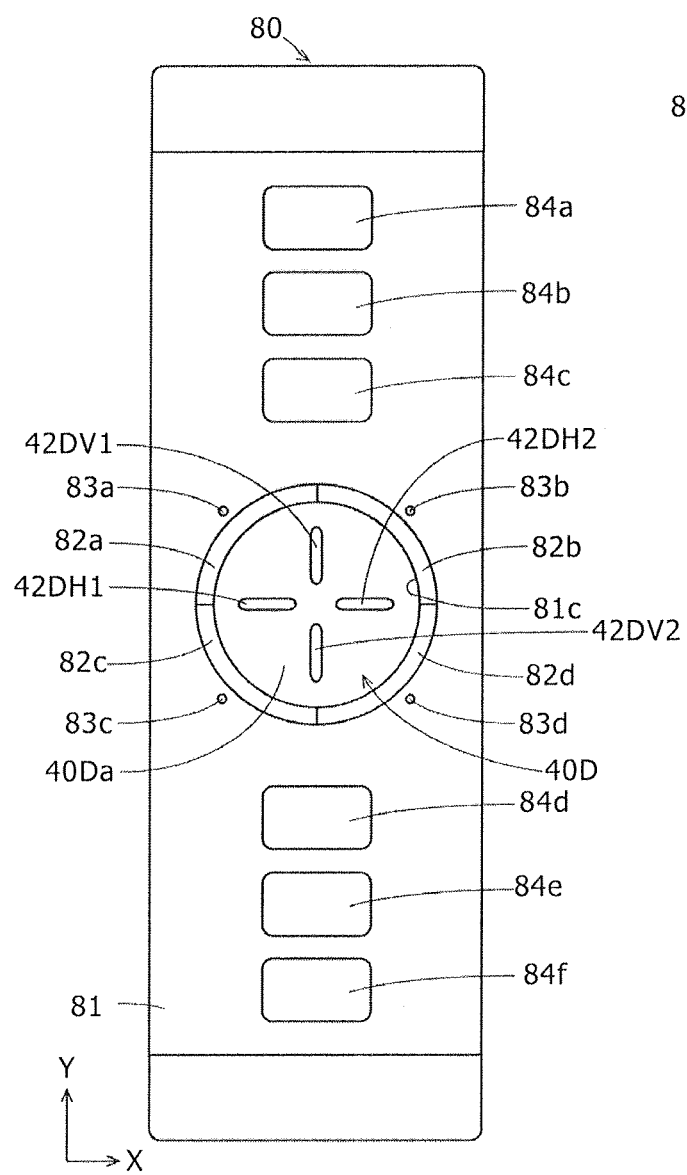
FIGS. 16A to 16C are diagrams for explaining the appearance of the indicator operation detecting device according to the sixth embodiment of this invention.
Figure 16C:
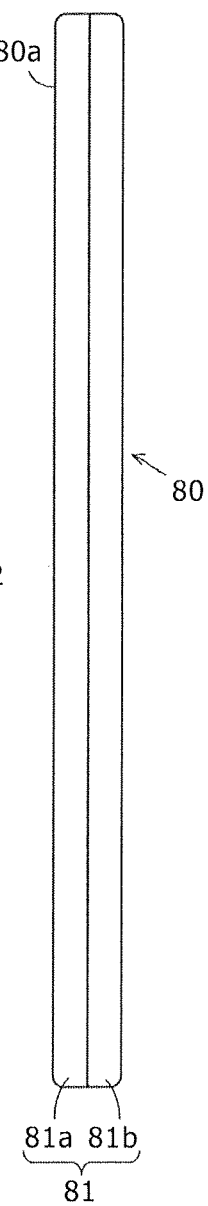
Figure 16B:
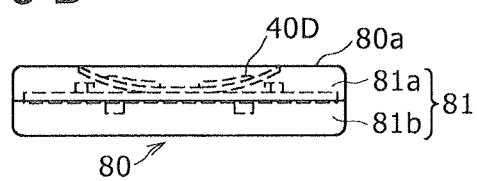

FIGS. 15A and 15B and 16A to 16C are diagrams for explaining the configuration of one example of an indicator operation detecting device of this sixth embodiment. FIG. 15A is a diagram when a printed board 70 housed in the chassis of the indicator operation detecting device of this sixth embodiment is viewed from the side of its board surface. FIG. 15B is a diagram when the printed board 70 is viewed along a direction parallel to its board surface. FIGS. 16A to 16C are diagrams for explaining one example of the appearance of an indicator operation detecting device 80 of this sixth embodiment. FIG. 16A is a front view from the side of the board surface of the printed board 70 housed in its chassis 81. FIG. 16B is a bottom view thereof and FIG. 16C is a side view thereof.

As shown in FIGS. 15A and 15B, the printed board 70 has an elongated rectangular shape. On this printed board 70, a sensor 10D, a surface operation member 40D, push button switches 71a to 71d, light emitting elements, specifically e.g., LEDs 72a to 72d, and push button switches 73a to 73f are provided and other circuit components (not shown) are provided on the front surface and the back surface for example.

The sensor 10D has a structure explained as a modification example of the sensor 10B' of the above-described fourth embodiment. Specifically, the sensor 10D of this example has the surface operation member 40D formed of a dielectric having a concave surface 40Da and a thin, shallow dish shape. In addition, without providing the X-axis-direction guide part 41X and the Y-axis-direction guide part 41Y in the concave surface 40Da, only ridges 42DH1 and 42DH2 along the horizontal direction of operation and ridges 42DV1 and 42DV2 along the vertical direction of operation are provided on the concave surface 40Da as guides for linear indication in the horizontal direction and the vertical direction of operation.

As shown in FIG. 15A, the sensor 10D includes an electrode group 11D in which plural first electrodes 12D disposed along a first direction and plural second electrodes 13D disposed along a second direction perpendicular to the first direction are arranged in a lattice manner similarly to the above-described embodiments, although not shown in detail in the diagram. In this example, the electrodes 12D and 13D are formed directly on the printed board 70. Furthermore, in this sixth embodiment, the sensor 10D is so formed that the first direction and the second direction are inclined at 45 degrees from the horizontal direction and the vertical direction of operation by the operator (corresponding to the horizontal direction and the vertical direction of the printed board 70) similarly to the fifth embodiment.

In FIGS. 15A and 15B, both the first electrodes 12D and the second electrodes 13D are shown on the front surface of the printed board 70 for convenience of explanation. However, actually one of the first electrodes 12D and the second electrodes 13D is formed on the front surface of the printed board 70 and the other is formed on the back surface of the printed board 70. The configuration may be so made that the first electrodes 12D and the second electrodes 13D are formed on different boards and these boards are stacked, of course.

In this case, the sensor 10D is so formed that the first electrodes 12D and the second electrodes 13D are disposed with an inclination of 45 degrees with respect to the horizontal direction and the vertical direction of the printed board 70. Thus, as explained for the above-described fifth embodiment, the area of the lead connected to the first electrodes 12D and the area of the lead connected to the second electrodes 13D can be formed within the width equivalent to the length of the diagonal of the rectangular area in which the electrode group 11D is formed in the horizontal direction of the printed board 70. This allows the rectangular area in which the electrode group 11D of the sensor 10D is formed to be formed into a laterally symmetric shape at the center part in the horizontal direction of the printed board 70 as shown in FIG. 15A. In the example of FIGS. 15A and 15B, the rectangular area of the sensor 10D is formed at the center part also in the vertical direction of the printed board 70.

In this example, the same circuit as the operation detecting circuit 20C including the coordinate conversion circuit 27 shown in FIG. 12 is employed as the operation detecting circuit connected to the sensor 10D. This operation detecting circuit is disposed on the printed board 70 as a circuit component partially or wholly made as an IC for example.

In this sixth embodiment, as shown in FIG. 15B, the surface operation member 40D having the concave surface 40Da and a circular, shallow dish shape is disposed on the rectangular area of the sensor 10D similarly to the fourth embodiment. As shown in FIG. 15A, on the concave surface 40Da of this surface operation member 40D, a horizontal guide part 41DH composed of the ridges 42DH1 and 42DH2 is formed along the horizontal direction of the printed board 70, i.e., with an inclination of 45 degrees relative to the X-axis direction of the output coordinate space of the sensor 10D. In addition, a vertical guide part 41DV composed of the ridges 42DV1 and 42DV2 is formed along the vertical direction of the printed board 70, i.e., with an inclination of 45 degrees relative to the Y-axis direction of the output coordinate space of the sensor 10D.

A second input part is formed by the horizontal guide part 41DH and the vertical guide part 41DV of the concave surface 40Da of the surface operation member 40D, and a first input part is formed by the other part of the concave surface 40Da.

Although not shown in the diagram, a dead-zone-forming sheet is deposited on the area around the circular surface operation member 40D, of the rectangular area of the sensor 10D, so that the indicator may be prevented from being detected in this area similarly to the above-described embodiments.

In this sixth embodiment, as shown in FIG. 15A, the push button switches 71a, 71b, 71c, and 71d are provided at four places on the upper left side, the upper right side, the lower left side, and the lower right side of the rectangular area of the sensor 10D on the printed board 70. Furthermore, adjacent to the respective push button switches 71a, 71b, 71c, and 71d, the LEDs 72a, 72b, 72c, and 72d are disposed, which are so configured as to emit light when the push button switches are turned on.

Moreover, three push button switches 73a, 73b, and 73c are disposed on the upper side of the sensor 10D in the vertical direction of the printed board 70 and three push button switches 73d, 73e, and 73f are disposed on the lower side of the sensor 10D.

The printed board 70 on which the sensor 10D, the surface operation member 40D, the push button switches 71a to 71d and 73a to 73f, the LEDs 72a to 72d, and other components are mounted in the above-described manner is housed in the chassis 81 of the indicator operation detecting device 80 shown in FIGS. 16A to 16C. The chassis 81 is composed of an upper half 81a and a lower half 81b as shown in FIGS. 16A, 16B, and 16C. The upper half 81a and the lower half 81b have an elongated shape that is similar to and larger than that of the printed board 70 so that the printed board 70 may be housed inside them. The printed board 70 is housed in the lower half 81b and the upper half 81a is engaged with the lower half 81b. Thereby, the printed board 70 is housed in the chassis 81.

The upper half 81a has a penetration hole 81c for exposing the whole or most part of the concave surface 40Da of the surface operation member 40D disposed on the sensor 10D to the external. When the upper half 81a is engaged with the lower half 81b, the highest part of the circumferential part of the concave surface 40Da of the surface operation member 40D is flush with a top surface 80a of the chassis 81 (surface of the upper half 81a) as shown in FIGS. 16A, 16B, and 16C.

Four operation elements 82a, 82b, 82c, and 82d are provided in a ring manner around the penetration hole 81c of the upper half 81a. These operation elements 82a, 82b, 82c, and 82d each have a size corresponding to an angular interval of 45 degrees and are operation elements for turning on/off the push button switches 71a, 71b, 71c, and 71d, respectively. Outside these operation elements 82a, 82b, 82c, and 82d, light-transmissive parts 83a, 83b, 83c, and 83d are formed, which allow emitted light of the LEDs 72a, 72b, 72c, and 72d to be visually observed from the external from the side of the top surface 80a.

On the upper side of the penetration hole 81c in the longitudinal direction of the upper half 81a, operation elements 84a, 84b, and 84c for on/off-operation of the push button switches 73a, 73b, and 73c are provided. On the lower side of the penetration hole 81c, operation elements 84d, 84e, and 84f for on/off-operation of the push button switches 73d, 73e, and 73f are provided.

Various setting functions associated with or relating to indication operation by the indicator can be assigned to pressing-down operation of the push button switches 71a to 71d and 73a to 73f by means of these plural operation elements 82a to 82d and 84a to 84f in a tablet device or a PC to which the indicator operation detecting device of this embodiment is connected.

The indicator operation detecting device 80 of this example is so configured as to be wirelessly connected to the tablet device or PC. A wireless transmission circuit for this purpose is provided on the printed board 70. The indicator operation detecting device 80 may be connected to the tablet device or PC by a cable 65, of course.

With the indicator operation detecting device 80 of the sixth embodiment configured in the above-described manner, the operator can make position indication in the sensor 10D by operating on the concave surface 40Da with a finger. Furthermore, the operator can make linear indication in the horizontal direction easily and surely by using the ridges 42DH1 and 42DH2 as a guide, and can make linear indication in the vertical direction easily and surely by using the ridges 42DV1 and 42DV2 as a guide.

In addition, the indicator operation detecting device 80 of the sixth embodiment has a line-symmetric shape whose axis of symmetry is the vertical direction as shown in FIG. 16A. Thus, it has a small size and a design-wise desirable shape. Moreover, in the indicator operation detecting device 80 of the sixth embodiment, forming the sensor 10D into a rhombic shape on the printed board 70 allows the plural push button switches relating to indication operation and the LEDs to be disposed around the surface operation member 40D and outside the area of the sensor 10D on the printed board 70. In this case, although these plural push button switches and LEDs are disposed, it is enough that the horizontal width of the chassis of the indicator operation detecting device 80 is set slightly longer than the length of the diagonal of the sensor 10D when the sensor 10D is disposed into the rhombic shape. Thus, there is an advantage that the small-size shape of the chassis 81 can be kept.

In the above-described sixth embodiment, the sensor 10D and the indicator operation detecting device 80 are so configured that the vertical direction is the axis of symmetry. However, it is also possible that the sensor 10D and the indicator operation detecting device 80 are so configured that the horizontal direction is the axis of symmetry.

In the above-described embodiment, a dead-zone-forming sheet is deposited on the sensor 10D in order to turn the area around the surface operation member 40D to a dead zone in which the indicator is not detected. However, the dead-zone-forming sheet does not have to be provided because the area around the surface operation member 40D is covered by the upper half 81a of the chassis 81.

The indicator operation detecting device 80 of the above-described sixth embodiment is configured as a device separate from a tablet device or a PC. However, it may be incorporated in a tablet device or a PC.

Figure 17:
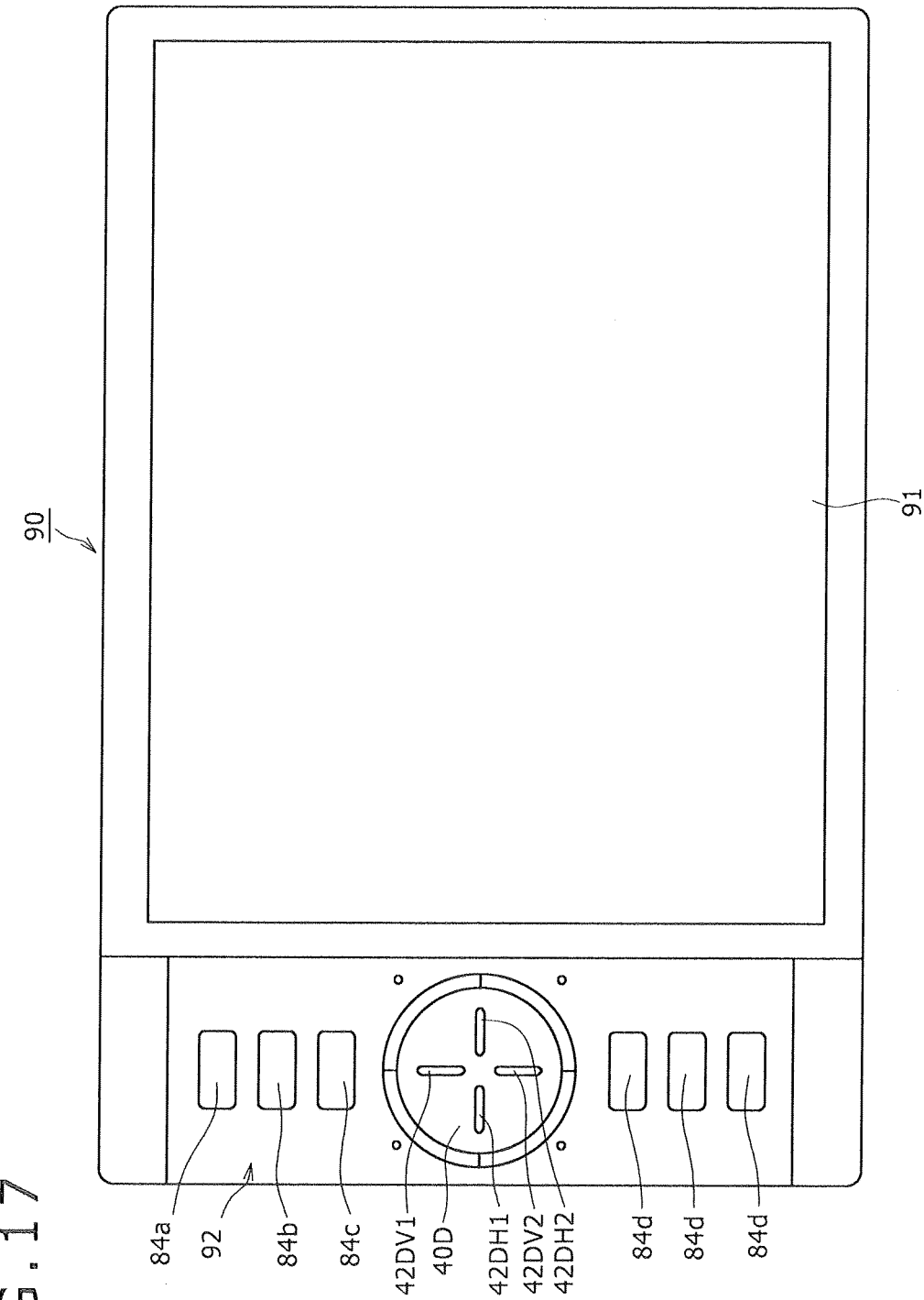
FIG. 17 is a diagram for explaining the appearance of another example of the indicator operation detecting device according to the sixth embodiment of this invention.

FIG. 17 is a diagram showing an example of the case in which the indicator operation detecting device 80 of the sixth embodiment is incorporated in a tablet device. A tablet device 90 of the example of FIG. 17 includes an operation input area 91 that accepts an indication input by an indicator using a position detecting device of the electromagnetic induction system or the capacitive system. In addition, the example of FIG. 17 includes an indicator operation detecting device section 92 having a configuration equivalent to the indicator operation detecting device 80 of the above-described sixth embodiment on the left side of this operation input area 91.

Seventh Embodiment

In the example of FIG. 17, the sensor of the operation input area 91 of the tablet device 90 and the sensor of the indicator operation detecting device section 92 have configurations separate from each other. However, the tablet device in which the indicator operation detecting device is incorporated can be configured by using a single sensor by dividing the detection area of one sensor into the operation input area for the tablet (hereinafter, referred to as the tablet input area) and the area for the surface operation part of the indicator operation detecting device (hereinafter, referred to as the surface operation part area). A seventh embodiment is an example of this case.

Figures 18A, 18B:
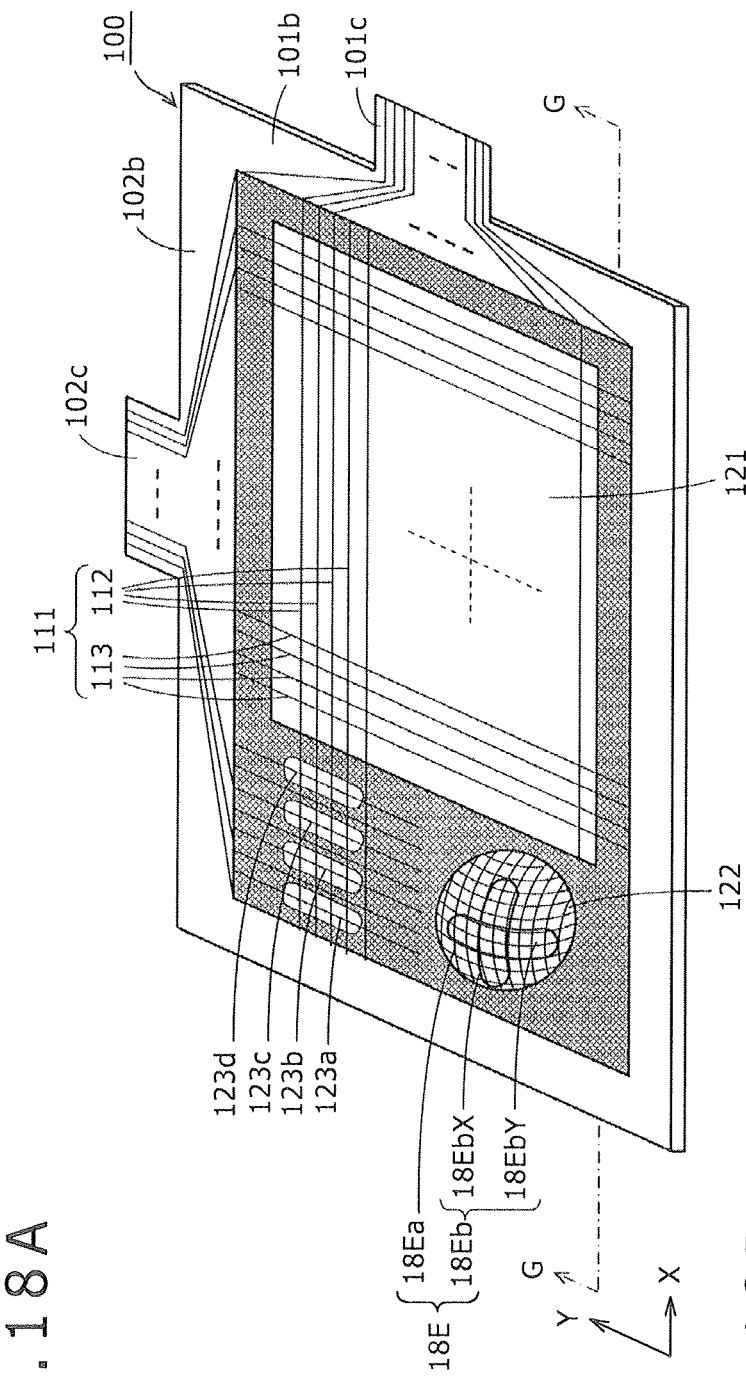
FIGS. 18A and 18B are diagrams for explaining the major parts of an indicator operation detecting device according to a seventh embodiment of this invention.

FIGS. 18A and 18B show a configuration example of a sensor 100 of a tablet device in this seventh embodiment. FIG. 18A is a perspective view when the sensor 100 is viewed from the front surface side. FIG. 18B is a sectional view along line G-G in FIG. 18A.

The sensor 100 of this example is also a capacitive sensor. As shown in FIG. 18B, the sensor 100 of this seventh embodiment has a four-layer structure obtained by stacking a first sheet-shaped substrate 101, a second sheet-shaped substrate 102, a protective sheet 103, and a dead-zone-forming sheet 104.

As shown in FIGS. 18A and 18B, plural first electrodes 112 are formed along a first direction on the first sheet-shaped substrate 101 as the second layer from the bottom. Furthermore, plural second electrodes 113 are formed along a second direction intersecting the first direction on the second sheet-shaped substrate 102 as the lowermost layer. In the example of FIGS. 18A and 18B, the first direction, along which the first electrodes 112 are formed, is defined as the X-axis direction of the output coordinate space of the sensor 100, and the second direction, along which the second electrodes 113 are formed, is defined as the Y-axis direction perpendicular to the X-axis direction. An electrode group 111 in a lattice manner is formed of the first electrodes 112 and the second electrodes 113.

The protective sheet 103 is deposited on the first sheet-shaped substrate 101. The dead-zone-forming sheet 104 is deposited on the protective sheet 103. In the dead-zone-forming sheet 104, penetration holes are made corresponding to a tablet input area 121, a surface operation part area 122, and switch input areas 123a, 123b, 123c, and 123d in order to turn the area except the tablet input area 121, the surface operation part area 122, and the switch input areas 123a, 123b, 123c, and 123d to a dead zone.

In this example, the surface operation part area 122 of the sensor 100 is a circular area and is formed as a dome-shaped part 18E by vacuum molding similarly to the above-described first embodiment. In this dome-shaped part 18E, a first input part 18Ea and a second input part 18Eb are formed similarly to the above-described first embodiment. The second input part 18Eb is composed of an X-axis-direction guide part 18EbX and a Y-axis-direction guide part 18EbY.

In this example, each of the switch input areas 123a to 123d is an area for realizing action similar to that when a push button switch is disposed in this area and is so configured that the switch can be turned on/off every time operation of tapping the area once is carried out.

As shown in FIGS. 18A and 18B, the first electrodes 112 are connected to an external connection part 101c via a lead area 101b of the first sheet-shaped substrate 101. The second electrodes 113 are connected to an external connection part 102c via a lead area 102b of the second sheet-shaped substrate 102.

The sensor 100 configured in this manner is housed in a chassis (not shown), so that the tablet device is formed. In this case, the tablet input area 121, the dome-shaped part 18E of the surface operation part area 122, and the switch input areas 123a, 123b, 123c, and 123d are exposed through the top surface of the upper half of the chassis so that the operator can bring a finger or the like into contact with them and operate them.

According to this seventh embodiment, the surface operation part having a three-dimensional curved shape can be formed together with the tablet input area by using only a single sensor. The surface operation part provides an effect that linear indication in the X-axis direction and the Y-axis direction can be surely made similarly to the above-described embodiments.

Although the operation detecting circuit for the sensor 100 of this example has a configuration similar to that of the operation detecting circuit 20 shown in FIG. 1, the output circuit 25 makes the output depending on which of the tablet input area 121, the surface operation part area 122, and the switch input areas 123a, 123b, 123c, and 123d the detected indication position of an indicator belongs to. In this case, as software processing, the output circuit 25 makes the output depending on which of the tablet input area 121, the surface operation part area 122, and the switch input areas 123a, 123b, 123c, and 123d the detected indication position belongs to. However, if the tablet device of this example is used as a peripheral device of a PC, the configuration may be so made that a software program of a driver for this tablet device, installed in the PC, executes software processing similar to that of the output circuit 25 as part thereof.

In this seventh embodiment, the output circuit 25 includes a correspondence table as to which coordinate values among all X- and Y-coordinate values in the sensor 100 are coordinate values of the tablet input area 121, the surface operation part area 122, and the switch input areas 123a, 123b, 123c, and 123d and coordinate values of the dead-zone area. In this correspondence table, regarding the X- and Y-coordinate values of the surface operation part area 122, the Z-direction coordinate values of the virtual curved surface according to the shape of the dome-shaped part 18E are also stored in association with the X- and Y-coordinate values.

Figure 19:
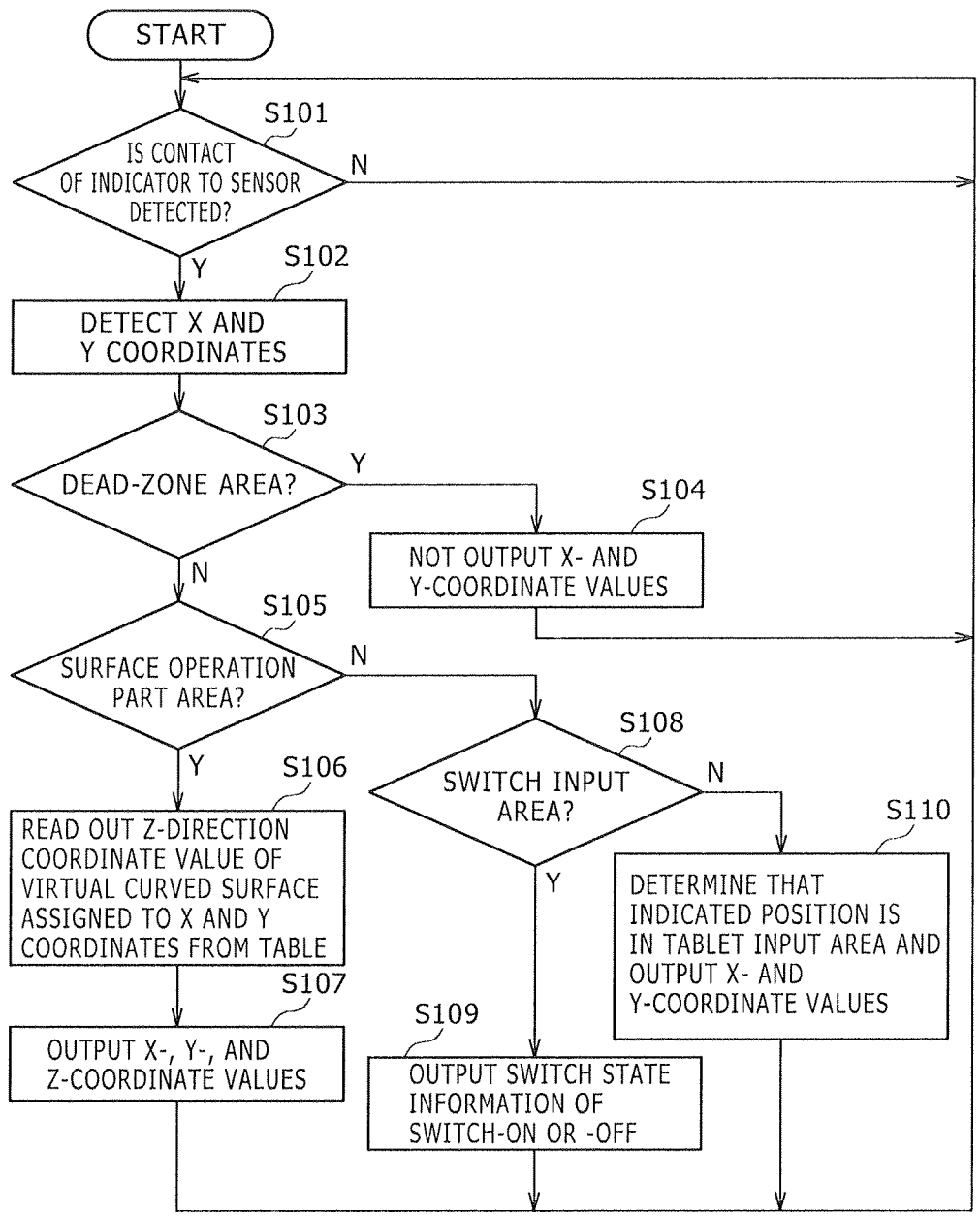
FIG. 19 is a flowchart for explaining an example of indicator detection processing operation in a sensor of the indicator operation detecting device according to the seventh embodiment of this invention.

FIG. 19 is a flowchart for explaining the flow of the software processing in the output circuit 25 of the operation detecting circuit in the seventh embodiment.

Specifically, first the output circuit 25 determines whether or not indication operation is carried out by an indicator in the sensor 100 based on a signal from the received signal processing circuit 24 (step S101). Next, the output circuit 25 detects the X- and Y-coordinates of the position indicated by the indicator (step S102). Then, the output circuit 25 refers to the above-described correspondence table and determines whether or not the X- and Y-coordinate values detected in the step S102 are ones of the dead-zone area (step S103). If they are coordinate values of the dead-zone area, these X- and Y-coordinate values are not output (step S104).

If it is determined in the step S103 that the X- and Y-coordinate values detected in the step S102 are not ones of the dead-zone area, the output circuit 25 determines whether or not the X- and Y-coordinate values detected in the step S102 are ones of the surface operation part area 122 (step S105). If it is determined in the step S105 that they are coordinate values of the surface operation part area 122, the output circuit 25 reads out the Z-direction coordinate value of the virtual curved surface assigned to the X- and Y-coordinate values from the correspondence table (step S106), and outputs it with the X- and Y-coordinate values detected in the step S102 (step S107). Then, the output circuit 25 returns the processing to the step S101 and repeats the processing of this step S101 and the subsequent steps.

If it is determined in the step S105 that the X- and Y-coordinate values detected in the step S102 are not ones of the surface operation part area 122, the output circuit 25 determines whether or not the X- and Y-coordinate values detected in the step S102 are ones of any of the switch input areas 123$a$, 123$b$, 123$c$, and 123$d$ (step S108).

If it is determined in this step S108 that the coordinate values are ones of any of the switch input areas 123$a$, 123$b$, 123$c$, and 123$d$, the output circuit 25 refers to the last state stored in a buffer regarding the determined switch input area and outputs switch state information indicating switch-off if the last state is switch-on and indicating switch-on if the last state is switch-off (step S109). Then, the output circuit 25 returns the processing to the step S101.

If it is determined in this step S108 that the X- and Y-coordinate values detected in the step S102 are none of the switch input areas 123$a$, 123$b$, 123$c$, and 123$d$, the output circuit 25 determines that the position indicated by the indicator is in the tablet input area 121 and outputs the X- and Y-coordinate values as they are (step S110). Then, the output circuit 25 returns the processing to the step S101.

In the above-described seventh embodiment, the dome-shaped part 18E is formed monolithically with the sensor 100 in the surface operation part area 122. However, a surface operation member that is a component separate from the sensor 100 and has a concave surface may be disposed in the surface operation part area 122 like the third embodiment, the fourth embodiment, and the sixth embodiment.

Other Embodiments and Modification Examples

In the above-described embodiments, a dead-zone area is made to set an indicator-detection-inhibited area in which the sensor does not detect the indicator around the surface operation part having a three-dimensional shape, such as the dome-shaped part 18 and the surface operation member 40 having a concave surface. However, the indicator-detection-inhibited area does not need to be set around the surface operation part having the three-dimensional shape. It is enough that the sensor detects linear indication operation at the X-axis-direction guide part and the Y-axis-direction guide part with high sensitivity and erroneous inputs can be prevented as much as possible. Thus, it is enough that the area around this surface operation part having the three-dimensional shape is a low-sensitivity detection area with indicator detection sensitivity lower than that at the surface operation part having the three-dimensional shape.

In the above-described embodiments, the X-axis-direction guide part and the Y-axis-direction guide part along the linear directions corresponding with the X-coordinate axis and the Y-coordinate axis of the X and Y coordinate space of the sensor are formed as the second input part. However, it is obvious that the linear guide parts provided in the second input part do not necessarily need to correspond with the X-coordinate axis and the Y-coordinate axis of the X and Y coordinate space of the sensor.

It should be understood by those skilled in the art that various modifications, combinations, sub-combinations and alterations may occur depending on design requirements and other factors insofar as they are within the scope of the appended claims or the equivalents thereof.

What is claimed is:

1. An indicator operation detecting device comprising:
a sensor including a plurality of first electrodes disposed along a first direction and a plurality of second electrodes disposed along a second direction different from the first direction to intersect the plurality of first electrodes;
an operation detecting circuit connected to the plurality of first electrodes and the plurality of second electrodes and configured to detect a position indicated by an indicator with respect to the sensor, based on a capacitive system, as a coordinate value on predetermined coordinate axes; and
a surface operation part disposed to receive an operation of the indicator with respect to the sensor,
wherein the surface operation part includes a first input part and a second input part,
the first input part has a first curved surface and employs a first corresponding predetermined area of the sensor as a first detection area, and
the second input part has a linear region having a second curved surface and employs a second corresponding linear area of the sensor surrounded by the first corresponding predetermined area for the first input part as a second detection area, the linear region includes a first linear band that extends along a direction relative to directions of the coordinate axes, and a second linear band that extends perpendicularly to the first linear band, the second curved surface shape of the linear region is different from the first curved surface shape of the first input part to be tactilely distinguishable from each other, and the second curved surface shape includes a portion at which curvature in a direction perpendicular to the direction is zero.

2. The indicator operation detecting device according to claim 1, wherein the first curved surface of the first input part is convex toward a side that the indicator contacts.

3. The indicator operation detecting device according to claim 2, wherein
the second curved surface shape of the linear region of the second input part is defined to provide a contact area with the indicator that is larger than a contact area with the indicator provided by the first curved surface shape of the first input part.

4. The indicator operation detecting device according to claim 1, wherein the first curved surface of the first input part is concave as viewed from a side that the indicator contacts.

5. The indicator operation detecting device according to claim 1, wherein
the second curved surface shape includes a portion that is a concave surface.

6. The indicator operation detecting device according to claim 1, wherein
the first and second linear bands intersect each other at center portions thereof.

7. The indicator operation detecting device according to claim 1, wherein
the sensor is integrally formed with the surface operation part.

8. The indicator operation detecting device according to claim 1, wherein
the sensor has a flat surface shape and the surface operation part is provided as a component separate from the sensor.

9. The indicator operation detecting device according to claim 1, wherein
the first input part is configured to have indicator detection sensitivity for the sensor that is lower than indicator detection sensitivity of the second input part.

10. The indicator operation detecting device according to claim 9, wherein
the first input part includes a first member configured to lower the indicator detection sensitivity of the first input part.

11. The indicator operation detecting device according to claim 1, wherein
an area outside the first corresponding predetermined area of the sensor is configured as a dead-zone area in which the indicator is not detected.

12. The indicator operation detecting device according to claim 11, wherein
the dead-zone area is formed by providing a second member, which inhibits detection of an operation of the indicator, in the area outside the first corresponding predetermined area of the sensor.

13. The indicator operation detecting device according to claim 12, wherein
the second member is a dielectric provided between the sensor and the surface operation part.

14. The indicator operation detecting device according to claim 12, wherein
the second member is an electrical conductor provided between the sensor and the surface operation part.

15. The indicator operation detecting device according to claim 11, wherein
the surface operation part is overlaid on the sensor, and the dead-zone area is formed by setting thickness of the surface operation part in the area outside the first corresponding predetermined area of the sensor larger than thickness of the surface operation part in the first corresponding predetermined area.

16. The indicator operation detecting device according to claim 1, wherein
the first linear band of the second input part is inclined by 45 degrees relative to the first direction along which the first electrodes are disposed or the second direction along which the second electrodes are disposed.

17. The indicator operation detecting device according to claim 16, wherein
the first direction along which the first electrodes are disposed and the second direction along which the second electrodes are disposed are inclined by 45 degrees relative to the directions of the coordinate axes that are perpendicular to each other, and the first linear band of the second input part is formed along one of the directions of the coordinate axes.

18. The indicator operation detecting device according to claim 16, wherein
the operation detecting circuit is configured to supply a transmission signal to the first electrodes of the sensor, and to receive a reception signal corresponding to the transmission signal from the second electrodes capacitively coupled to the first electrodes, and
a first lead part led out from the first electrodes of the sensor and a second lead part led out from the second electrodes extend in an identical direction.

19. The indicator operation detecting device according to claim 16, wherein
the operation detecting circuit is configured to process directions inclined by 45 degrees from the first direction and the second direction as the directions of coordinate axes of the sensor.

* * * * *